US012639504B2

(12) United States Patent
Park et al.

(10) Patent No.: US 12,639,504 B2
(45) Date of Patent: May 26, 2026

(54) SEMICONDUCTOR DEVICE AND METHOD OF FABRICATING THE SAME

(71) Applicant: Samsung Electronics Co., Ltd., Suwon-si (KR)

(72) Inventors: Seong-Yul Park, Hwaseong-si (KR); Youngdoo Jeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 708 days.

(21) Appl. No.: 17/882,744

(22) Filed: Aug. 8, 2022

(65) Prior Publication Data

US 2023/0238286 A1     Jul. 27, 2023

(30) Foreign Application Priority Data

Jan. 21, 2022     (KR) ........................ 10-2022-0009155

(51) Int. Cl.
*G03F 7/00* (2006.01)
*G06F 30/392* (2020.01)
(Continued)

(52) U.S. Cl.
CPC ........ *G06F 30/398* (2020.01); *G03F 7/70441* (2013.01); *G06F 30/392* (2020.01);
(Continued)

(58) Field of Classification Search
CPC ................. G06F 30/398; G06F 30/392; G03F 7/70441; G03F 1/36; H01L 22/20;
(Continued)

(56) References Cited

U.S. PATENT DOCUMENTS

| | | | |
|---|---|---|---|
| 8,255,838 B2 | 8/2012 | Xue et al. | |
| 9,201,027 B2 | 12/2015 | Kohli et al. | |
| 10,534,257 B2 | 1/2020 | Tetiker et al. | |
| 10,642,160 B2 | 5/2020 | Sun et al. | |

(Continued)

FOREIGN PATENT DOCUMENTS

| | | |
|---|---|---|
| KR | 2008-0113726 A | 12/2008 |
| KR | 2016-0003978 A | 1/2016 |
| KR | 2021-0158607 A | 12/2021 |

*Primary Examiner* — Jack Chiang
*Assistant Examiner* — Anwer Ahmed Alawdi
(74) *Attorney, Agent, or Firm* — Harness, Dickey & Pierce, P.L.C.

(57) ABSTRACT

A method of fabricating a semiconductor device may include designing a layout including first and second gate patterns, first and second dummy gate patterns, and third and fourth gate patterns sequentially arranged in a first direction; forming first to fourth sacrificial patterns and first and second dummy sacrificial patterns, which correspond to the first to fourth gate patterns and the first and second dummy gate patterns respectively, on a substrate using a photomask manufactured based on the layout; and performing an optical proximity correction on the layout. The optical proximity correction may include measuring distances between adjacent ones of the sacrificial and dummy sacrificial patterns in the first direction to provide measured distances, comparing a mean value of the measured distances with a mean value of target distances to obtain a first distance therebetween, and reducing a distance between the first and second dummy gate patterns by the first distance.

15 Claims, 41 Drawing Sheets

(51) Int. Cl.

| | |
|---|---|
| *G06F 30/398* | (2020.01) |
| *H01L 21/66* | (2006.01) |
| *H10D 30/67* | (2025.01) |
| *H10D 84/01* | (2025.01) |
| *H10D 84/85* | (2025.01) |
| *H10D 84/03* | (2025.01) |

(52) U.S. Cl.

CPC ......... *H01L 22/20* (2013.01); *H10D 30/6735* (2025.01); *H10D 84/0172* (2025.01); *H10D 84/0188* (2025.01); *H10D 84/85* (2025.01); *H10D 84/038* (2025.01)

(58) Field of Classification Search

CPC ........... H10D 30/6735; H10D 84/0172; H10D 84/0188; H10D 84/85; H10D 84/038; H10D 30/797; H10D 30/014; H10D 30/43; H10D 30/6757; H10D 64/017; H10D 62/822; H10D 64/256; H10D 62/121; H10D 62/151; H10D 84/0151; H10D 84/0135; H10D 89/10; H10D 84/80; B82Y 10/00

See application file for complete search history.

(56) References Cited

U.S. PATENT DOCUMENTS

| | | | |
|---|---|---|---|
| 10,677,589 B2 | 6/2020 | Verma et al. | |
| 11,062,911 B2 | 7/2021 | Lie et al. | |
| 2004/0250232 A1* | 12/2004 | Kobozeva ................. | G03F 1/36 716/53 |
| 2005/0076320 A1* | 4/2005 | Maeda ...................... | G03F 1/36 257/E27.108 |
| 2009/0044164 A1* | 2/2009 | Lee ........................... | G03F 1/36 716/119 |
| 2010/0124823 A1* | 5/2010 | Yeh .................... | H10D 84/0179 257/E21.536 |
| 2014/0203377 A1* | 7/2014 | Song ..................... | H10B 10/12 257/401 |
| 2021/0066283 A1 | 3/2021 | Kim et al. | |

* cited by examiner

Figure 25A:
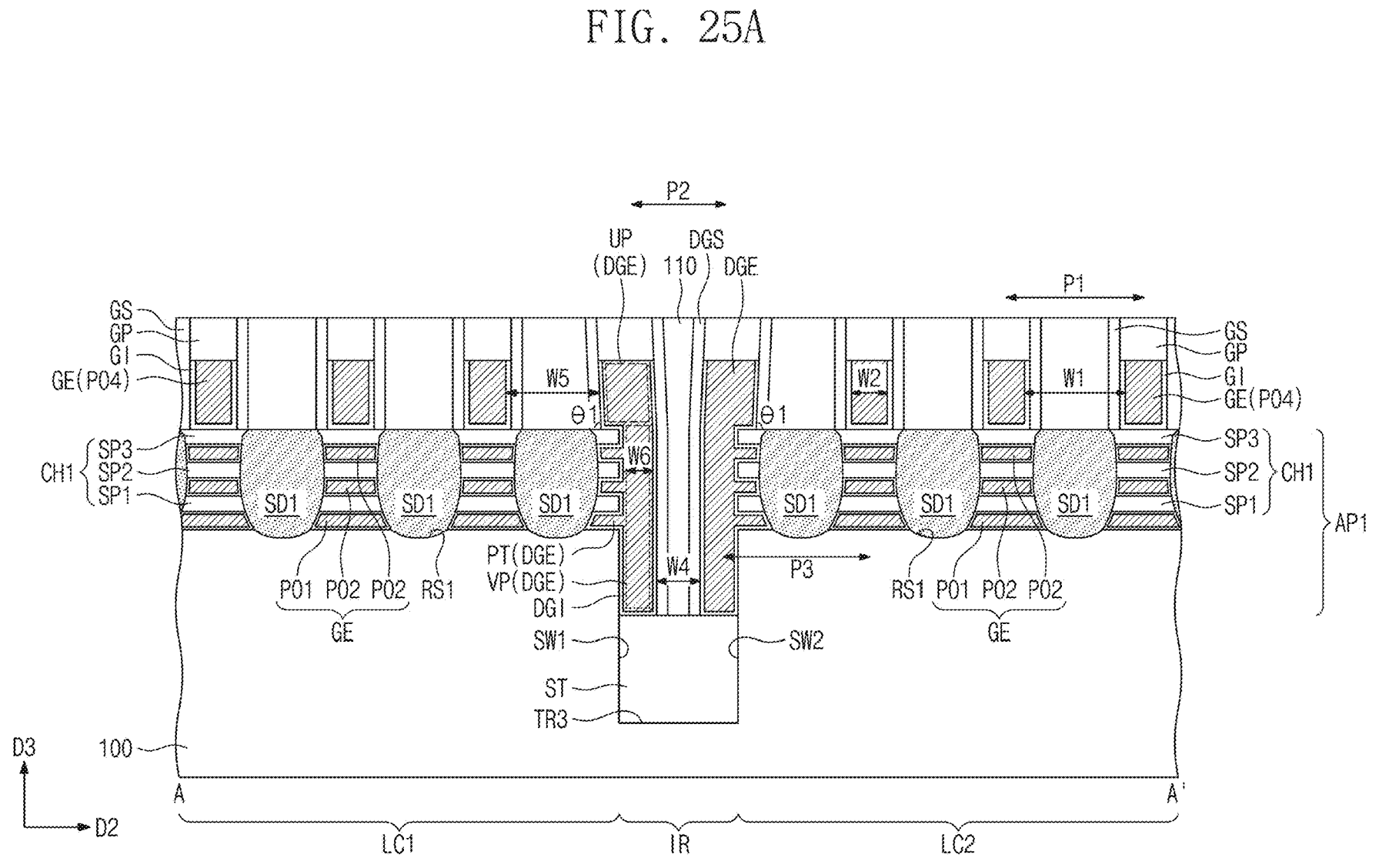

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0009155, filed on Jan. 21, 2022 in the Korean Intellectual Property Office, the entire contents of which are hereby incorporated by reference.

BACKGROUND

The present disclosure relates to a semiconductor device and/or a method of fabricating the same, and in particular, to a semiconductor device including a field effect transistor and/or a method of fabricating the same.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both memory and logic elements. As the electronic industry advances, demand may increase for semiconductor devices with improved characteristics. For example, demand may increase for semiconductor devices with high reliability, high performance, and/or multiple functions. To meet this demand, structural complexity and/or integration density of semiconductor devices may increase.

SUMMARY

An embodiment of inventive concepts provides a semiconductor device including a field effect transistor with improved electrical and reliability characteristics and/or a method of fabricating the same.

According to an embodiment of inventive concepts, a method of fabricating a semiconductor device may include designing a layout, the layout including a first gate pattern, a second gate pattern, a first dummy gate pattern, a second dummy gate pattern, a third gate pattern, and a fourth gate pattern, which may be sequentially arranged in a first direction; forming a first sacrificial pattern, a second sacrificial pattern, a third sacrificial pattern, a fourth sacrificial pattern, a first dummy sacrificial pattern, and a second dummy sacrificial pattern on a substrate using a first photomask manufactured based on the layout; performing an optical proximity correction on the layout to provide an OPC-modified layout. The first sacrificial pattern, the second sacrificial pattern, the third sacrificial pattern, the first dummy sacrificial pattern, and the second dummy sacrificial pattern may correspond to the first gate pattern, the second gate pattern, the third gate pattern, the fourth gate pattern, the first dummy gate pattern, and the second dummy gate pattern, respectively. The optical proximity correction may include measuring distances between adjacent ones of the first sacrificial pattern, the second sacrificial pattern, the third sacrificial pattern, the fourth sacrificial pattern, the first dummy sacrificial pattern, and the second dummy sacrificial pattern, which are adjacent to each other in the first direction, to provide measured distances; comparing a mean value of the measured distances with a mean value of target distances to obtain a first distance, the first distance corresponding to a difference between the measured distances and the target distances; and reducing a distance between the first dummy gate pattern and the second dummy gate pattern by the first distance.

According to an embodiment of inventive concepts, a method of fabricating a semiconductor device may include designing a layout, the layout including a first standard cell and a second standard cell, the first standard cell including a first gate pattern, a second gate pattern, and a first dummy gate pattern sequentially arranged in a first direction, the second standard cell including a second dummy gate pattern, a third gate pattern, and a fourth gate pattern sequentially arranged in the first direction, and the first standard cell and the second standard cell being adjacent to each other in the first direction; forming a first sacrificial pattern, a second sacrificial pattern, a third sacrificial pattern, a fourth sacrificial pattern, a first dummy sacrificial pattern, and a second dummy sacrificial pattern on a substrate using a photomask manufactured based on the layout; and performing an optical proximity correction on the layout to provide an OPC-modified layout. The first sacrificial pattern, the second sacrificial pattern, the third sacrificial pattern, the first dummy sacrificial pattern, and the second dummy sacrificial pattern may correspond to the first gate pattern, the second gate pattern, the third gate pattern, the fourth gate pattern, the first dummy gate pattern, and the second dummy gate pattern, respectively. The first dummy gate pattern and the second dummy gate patterns may be adjacent to each other in the first direction. The optical proximity correction may include measuring distances between adjacent ones of the first sacrificial pattern, the second sacrificial pattern, the third sacrificial pattern, the fourth sacrificial pattern, the first dummy sacrificial pattern, and the second dummy sacrificial pattern, which are adjacent to each other in the first direction, to provide measured distances; comparing a mean value of the measured distances with a mean value of target distances to obtain a first distance, the first distance corresponding to a difference between the measured distances and the target distances; and biasing the first dummy gate pattern toward the second dummy gate pattern by half of the first distance and biasing the second dummy gate pattern toward the first dummy gate pattern by half of the first distance.

According to an embodiment of inventive concepts, a semiconductor device may include a first logic cell and a second logic cell on a substrate, the first logic cell and the second logic cell being spaced apart from each other in a first direction, the substrate including a trench, the trench including a first side surface and a second side surface facing each other, the trench defining a first active pattern in the first logic cell and a second active pattern in the second logic cell; an isolation region on the substrate between the first logic cell and the second logic cell, the isolation region separating the first active pattern and the second active pattern from each other; a first dummy gate electrode on the substrate adjacent to the first side surface of the trench, the first dummy gate electrode extending in a second direction crossing the first direction; a second dummy gate electrode on the substrate adjacent to the second side surface of the trench and extending in the second direction; a first gate electrode on the first active pattern and spaced apart from the first dummy gate electrode; and a second gate electrode on the second active pattern and spaced apart from the second dummy gate electrode. A pitch between the first dummy gate electrode and the second dummy gate electrode may be smaller than a pitch between the first gate electrode and the first dummy gate electrode.

BRIEF DESCRIPTION OF THE DRAWINGS

FIG. 3 is a layout of a standard cell designed by the design method of FIG. 2.

FIG. 4 is a plan view illustrating sacrificial patterns, which are formed using the layout of FIG. 3.

FIG. 8 is a layout of a standard cell designed by the design method of FIG. 2.

FIGS. 14, 16, 18, 20, 22, and 24 are plan views illustrating a method of fabricating a semiconductor device, according to an embodiment of inventive concepts.

FIGS. 15, 17A, 19A, 21A, 23A, and 25A are sectional views taken along lines A-A' of FIGS. 14, 16, 18, 20, 22, and 24, respectively.

DETAILED DESCRIPTION

Example embodiments of inventive concepts will now be described more fully with reference to the accompanying drawings, in which example embodiments are shown.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
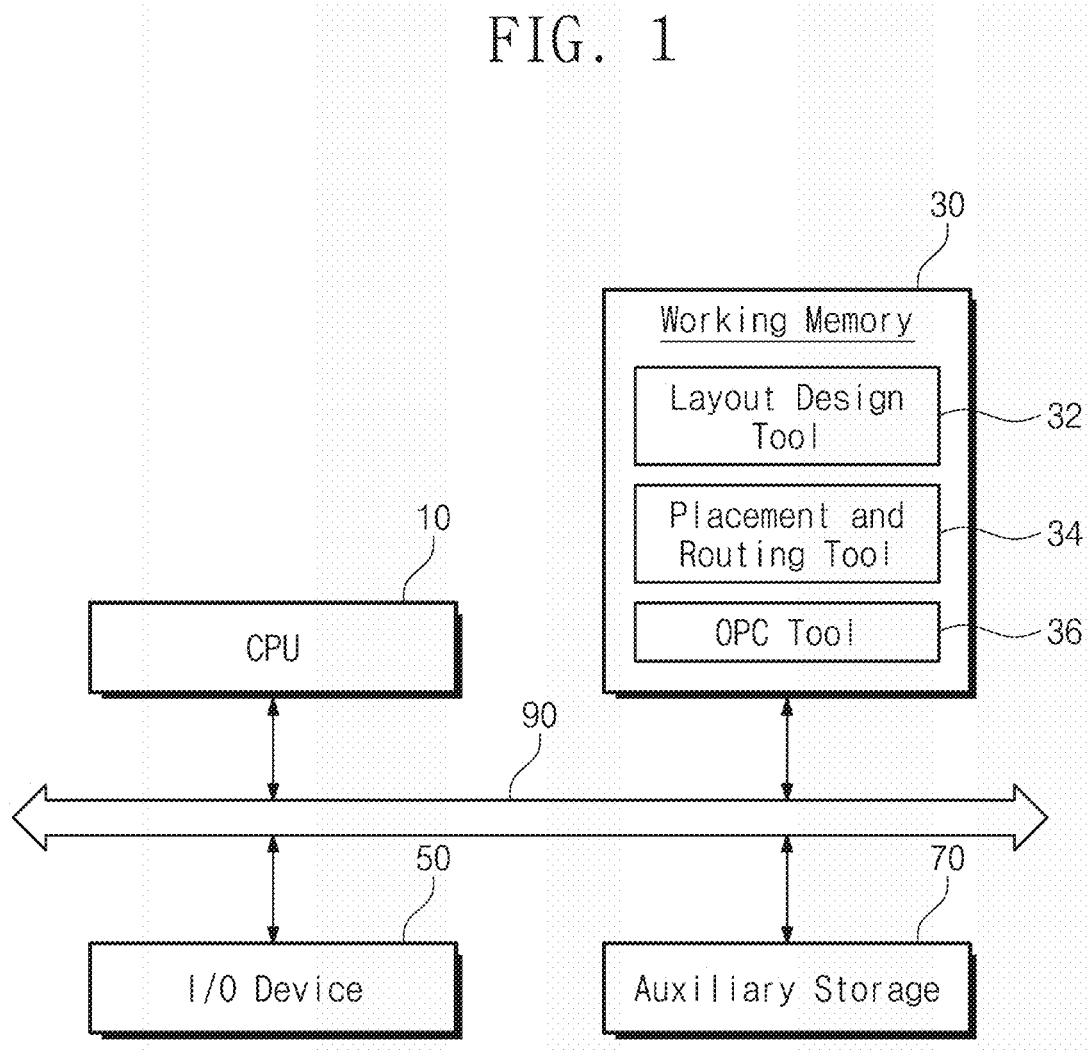
FIG. 1 is a block diagram illustrating a computer system for performing a semiconductor design process, according to an embodiment of inventive concepts.

FIG. 1 is a block diagram illustrating a computer system which is configured to execute a semiconductor design process, according to an embodiment of inventive concepts. Referring to FIG. 1, a computer system may include a CPU 10, a working memory 30, an input-output device 50, and an auxiliary storage 70. In an embodiment, the computer system may be provided as a system which is customized to execute a layout design process according to inventive concepts. Furthermore, the computer system may be configured to carry out various design and check simulation programs.

The CPU 10 may be configured to run a variety of software programs (e.g., application programs, operating systems, and device drivers) which are executed on the computer system. The CPU 10 may run an operating system loaded on the working memory 30. Furthermore, the CPU 10 may run various application programs, which are executed based on the operating system. For example, the CPU 10 may run a layout design tool 32, a placement and routing tool 34, and/or an optical proximity correction (OPC) tool 36, which are loaded on the working memory 30, thereby transforming the CPU 10 into a special-purpose CPU configured to perform some operations in methods according to example embodiments, such as operations S10 to S70 in the method of FIG. 2 and operations S71 to S73 in the method of FIG. 6 discussed below.

The operating system or the application programs may be loaded on the working memory 30. For example, when the computer system starts a booting operation, an image of the operating system (not shown) stored in the auxiliary storage 70 may be loaded on the working memory 30 in accordance with a desired and/or alternative predetermined booting sequence. The overall input/output operations of the computer system may be managed by the operating system. Similarly, some application programs, which are selected by a user or are provided for basic services, may be loaded on the working memory 30.

The layout design tool 32, which is used for the layout design process, may be loaded on the working memory 30 from the auxiliary storage 70. The placement and routing tool 34, which is used to place the designed standard cells and to route the placed standard cells, may be loaded on the working memory 30 from the auxiliary storage 70. The OPC tool 36, which is used to execute an OPC process on the designed layout data, may be loaded on the working memory 30 from the auxiliary storage 70.

The layout design tool 32 may be configured to change biasing data for some layout patterns; for example, the layout design tool 32 may be configured to allow the specific layout patterns to have shapes and positions different from those given by a design rule. Furthermore, the layout design tool 32 may be configured to execute a design rule check (DRC) operation, under the condition of the changed bias data. The working memory 30 may include one of volatile memory devices (e.g., static or dynamic random access memory (SRAM or DRAM) devices) and/or nonvolatile memory devices (e.g., PRAM, MRAM, ReRAM, FRAM, and NOR FLASH memory devices).

The input-output device 50 may be configured to control user's data to be input and output through a user interface device. For example, the input-output device 50 may include a keyboard or a monitor, which are used to receive relevant information from a designer. By using the input-output device 50, it may be possible for the designer to receive information on regions or data paths, at which adjusted operating characteristics are needed, of a semiconductor device. The input-output device 50 may also be used to display a status or result of a process executed by the OPC tool 36.

The auxiliary storage 70 may be provided as a storage medium of the computer system. The auxiliary storage 70 may be used to store the application programs, the image of the operating system, and various kinds of data. The auxiliary storage 70 may be or include one of memory cards (e.g., MMC, eMMC, SD, MicroSD, and so forth), a hard disk drive (HDD), and/or a solid state drive (SSD). The auxiliary storage 70 may include a NAND FLASH memory device with a large memory capacity. In an embodiment, the auxiliary storage 70 may include next-generation non-volatile memory devices (e.g., PRAM, MRAM, ReRAM, and FRAM devices) or a NOR FLASH memory device.

A system interconnector 90 may be further provided as a system bus for an internal network of the computer system. The CPU 10, the working memory 30, the input-output device 50, and the auxiliary storage 70 may be electrically connected to each other through the system interconnector 90 to exchange data between them. However, the structure of the system interconnector 90 may not be limited to this example, and in an embodiment, an additional data-exchanging element may be further provided to improve the efficiency in a data processing process.

Figure 2:
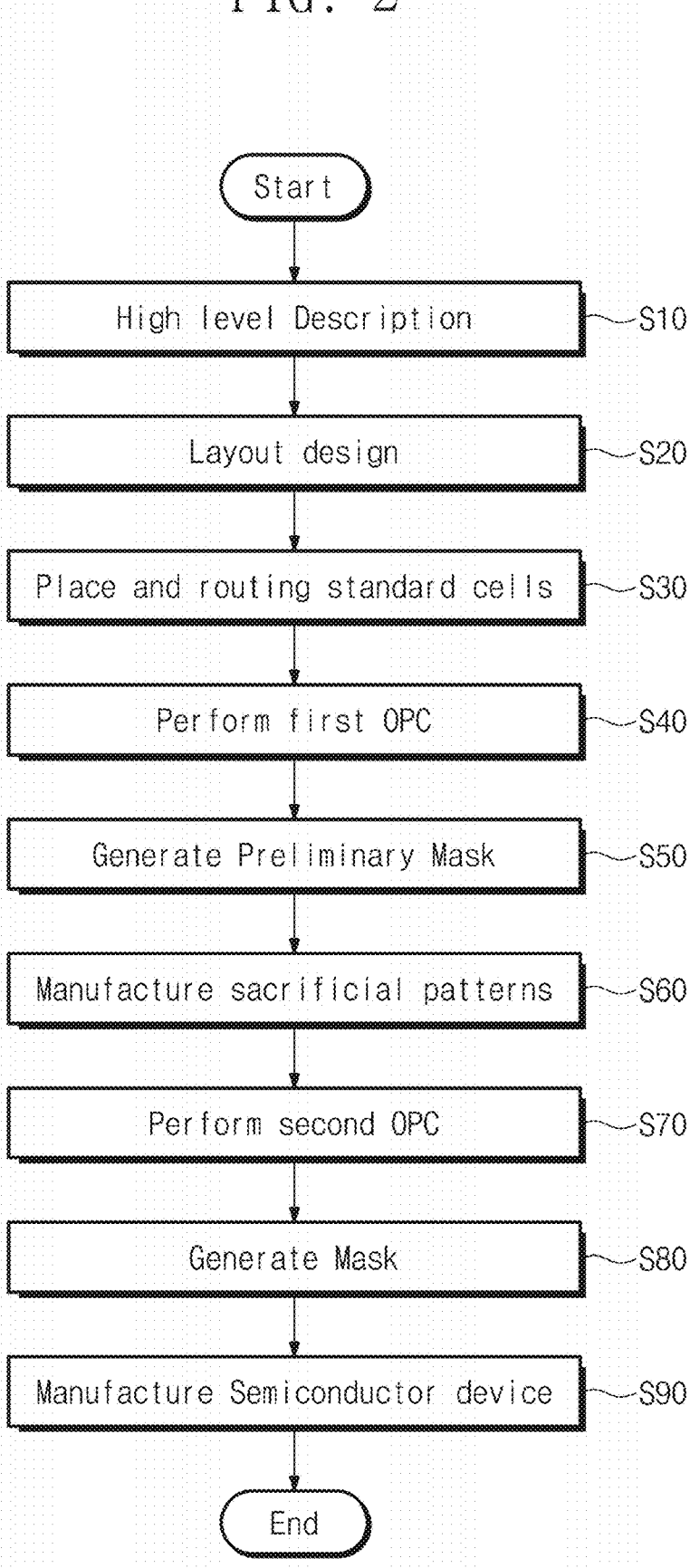
FIG. 2 is a flow chart illustrating a method of designing and fabricating a semiconductor device, according to an embodiment of inventive concepts.

FIG. 2 is a flow chart illustrating a method of designing and fabricating a semiconductor device, according to an embodiment of inventive concepts.

Referring to FIG. 2, a high-level design process may be performed on a semiconductor integrated circuit using the computer system described with reference to FIG. 1 (in S10). For example, in the high-level design process, an integrated circuit, which is a target object in a design process, may be described in terms of a high-level computer language. In an embodiment, the C language may be an example of the high-level computer language. Circuits designed by the high-level design process may be more concretely described by a register-transfer-level (RTL) coding or a simulation. Furthermore, codes generated by the RTL coding may be converted into a netlist, and the results may be combined to describe the entirety of the semiconductor device. The combined schematic circuit may be verified by a simulation tool, and in certain cases, an adjusting operation may be further performed in consideration of a result of the verification operation.

A layout design operation may be performed to realize a logically-finalized form of the semiconductor integrated circuit on a silicon substrate (in S20). For example, the schematic circuit prepared in the high-level design process or the corresponding netlist may be referred during the layout design operation.

A cell library, which is used for the layout design operation, may contain information on operation, speed, and power consumption of a standard cell. Most of the layout design tools may be configured to define a cell library, which is used to represent a gate-level circuit with a layout. Here, the layout may be prepared to define geometrical features (e.g., shapes, positions, or dimensions) of patterns, which are used to form transistors and metal lines to be actually integrated on a silicon substrate. For example, in order to actually form an inverter circuit on a silicon substrate, it may be necessary to properly place layouts for patterns (e.g., PMOS, NMOS, N-WELL, gate electrodes, and metal lines thereon). For this, a searching operation may be performed to choose the most suitable inverter layout from the inverter layouts which have been stored in the cell library.

Operations of placing and routing various standard cells, which are stored in the cell library, may be performed (in S30). For example, the standard cells may be two-dimensionally placed. Then, high-level lines or routing patterns may be placed on the placed standard cells. By performing the routing operation, it may be possible to connect the placed standard cells to each other in the previously-designed manner. The operations of placing and routing the standard cells may be automatically executed by the placement and routing tool 34.

After the routing operation, a verification operation may be performed on the layout to check whether there is a portion violating the given design rule. In an embodiment, the verification operation may include evaluating verification items, such as a design rule check (DRC), an electrical rule check (ERC), and a layout versus schematic (LVS). Here, the DRC may be performed to evaluate whether the layout meets the given design rule, the ERC may be performed to evaluate whether there is an electrical disconnection issue in the layout, and the LVS may be performed to evaluate whether the layout is prepared to coincide with the gate-level netlist.

A first optical proximity correction (OPC) operation may be performed (in S40). In general, optical proximity effects may occur when a photolithography process using a photomask manufactured based on the designed layout is performed on a silicon wafer. The OPC operation may be performed to correct the optical proximity or distortion issues in the photolithography process. For example, in the OPC operation, the layout may be modified to reduce a difference in shape between designed patterns and actually-formed patterns, which is caused by the optical proximity effects or during an exposure operation of the photolithography process. As a result of the OPC operation, the designed shapes and positions of the layout patterns may be slightly changed or biased.

A preliminary photomask may be generated, based on the layout modified by the first OPC operation (in S50). The preliminary photomask may be manufactured by patterning a chromium layer, which is formed on a glass substrate, in such a way to depict the layout pattern.

Sacrificial patterns and dummy sacrificial patterns may be formed using the generated preliminary photomask (in S60). In the process of fabricating a semiconductor device using the preliminary photomask, various exposure and etching processes may be repeated. Sacrificial patterns, which have shapes defined in the layout design operation, may be sequentially formed on a silicon substrate through these processes.

A second OPC operation may be performed (S70). The second OPC operation may include measuring distances between the sacrificial patterns and the dummy sacrificial patterns to prepare a large amount of distance data, plotting the data to prepare a normal distribution curve, comparing this with a target distance, and biasing the designed shapes and positions of the layout patterns. The second OPC operation will be described in more detail with reference to FIGS. 6 and 7.

A photomask may be manufactured, based on the layout biased by the second OPC operation (in S80). In general, the photomask may be manufactured by patterning a chromium layer, which is formed on a glass substrate, in such a way to depict the layout pattern.

A semiconductor device may be fabricated using the manufactured photomask (in S90). In the actual fabricating process using the photomask, various exposing and etching operations may be performed or repeated to sequentially form patterns, which are defined in the layout design operation, on a silicon substrate.

Figure 3:
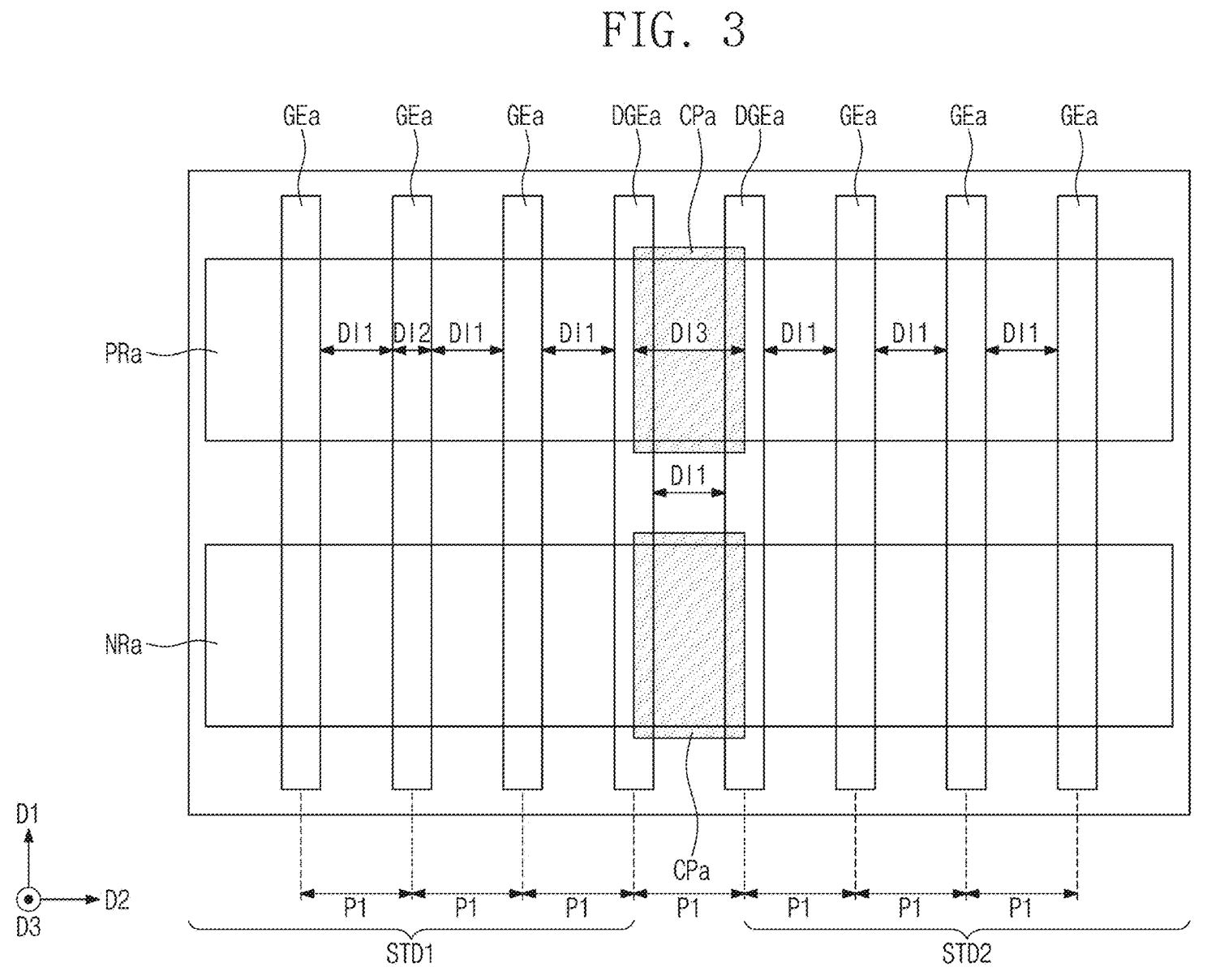

FIG. 3 is a layout of a standard cell designed by the design method of FIG. 2. In detail, FIG. 3 may correspond to a layout, before the second OPC operation (in S70).

Referring to FIG. 3, the designed layout of the standard cell may include a first standard cell STD1 and a second standard cell STD2, which are spaced apart from each other in a second direction D2. Each of the first and second standard cells STD1 and STD2 may include gate patterns GEa and a dummy gate pattern DGEa. The layout may further include a first active region PRa and a second active region NRa, which are provided to cross the first and second standard cells STD1 and STD2. The layout may further include cutting patterns CPa, which are provided between the first and second standard cells STD1 and STD2. Furthermore, the layout may further include other layout patterns (e.g., interconnection patterns, via patterns, active contact patterns, and so forth). In order to reduce complexity in the drawings, such layout patterns (e.g., interconnection patterns, via patterns, active contact patterns, and so forth) in the standard cells may be omitted from FIG. 3.

The first active region PRa may be extended in the second direction D2 to cross the first and second standard cells STD1 and STD2. The second active region NRa may be extended in the second direction D2 to cross the first and second standard cells STD1 and STD2. The first active region PRa and the second active region NRa may be spaced apart from each other in a first direction D1. The first active region PRa and the second active region NRa may define a PMOSFET region PR and an NMOSFET region NR, respectively, which will be described below.

The gate patterns GEa may be extended in the first direction D1 and may be arranged in the second direction D2 crossing the first direction D1. The gate patterns GEa may be arranged at a first pitch P1. In the present specification, the term "pitch" may mean a distance between lines passing through centers of two adjacent elements (e.g., first and second patterns adjacent to each other). The gate patterns GEa may define sacrificial patterns PP and gate electrodes GE, which will be described below.

The dummy gate patterns DGEa may be extended in the first direction D1 and may be arranged in the second direction D2. The dummy gate pattern DGEa on the first standard cell STD1 may be placed to be adjacent to the dummy gate pattern DGEa on the second standard cell STD2. The dummy gate patterns DGEa may be arranged at the first pitch P1. The dummy gate pattern DGEa and the gate pattern GEa adjacent thereto may be arranged at the first pitch P1. The dummy gate patterns DGEa may define dummy sacrificial patterns DPP and dummy gate electrodes DGE, which will be described below.

The cutting pattern CPa may be disposed between the first and second standard cells STD1 and STD2. The first and second standard cells STD1 and STD2 may be separated from each other by the cutting pattern CPa. The cutting pattern CPa may define a third trench TR3, which will be described below. A portion of the dummy gate pattern DGEa may be vertically overlapped with the cutting pattern CPa.

All of distances between adjacent ones of the gate patterns GEa, between adjacent ones of the dummy gate patterns DGEa, and between the gate pattern GEa and the dummy gate pattern DGEa, which are adjacent to each other, may be defined as a first distance DI1. A width of each of the gate patterns GEa and the dummy gate patterns DGEa may be defined as a second distance DI2. A width of the cutting pattern CPa may be defined as a third distance DI3. The first pitch P1 may be substantially equal to a sum of the first distance DI1 and the second distance DI2. The first pitch P1 may be substantially equal to the third distance DI3.

Figure 4:
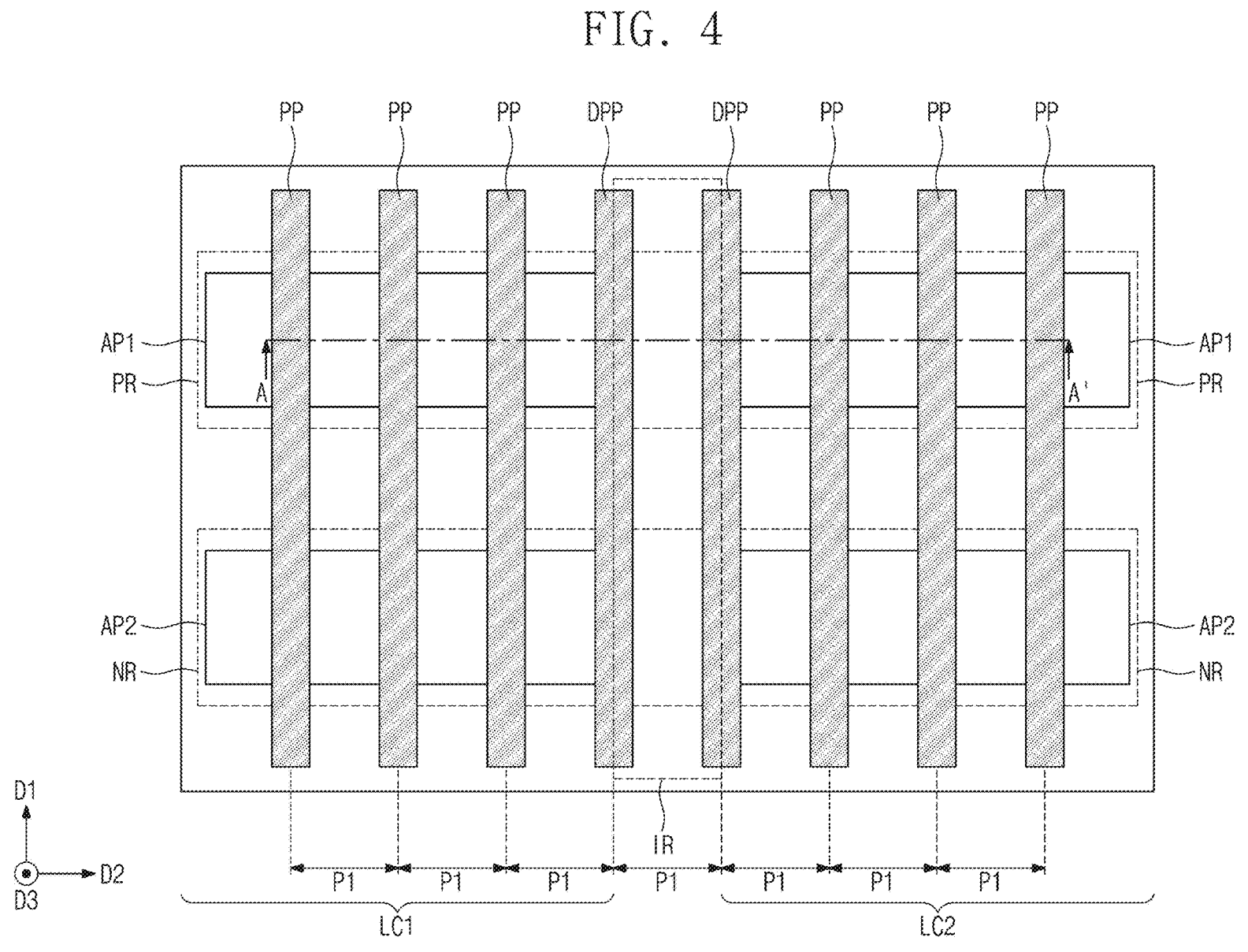
Figure 5:
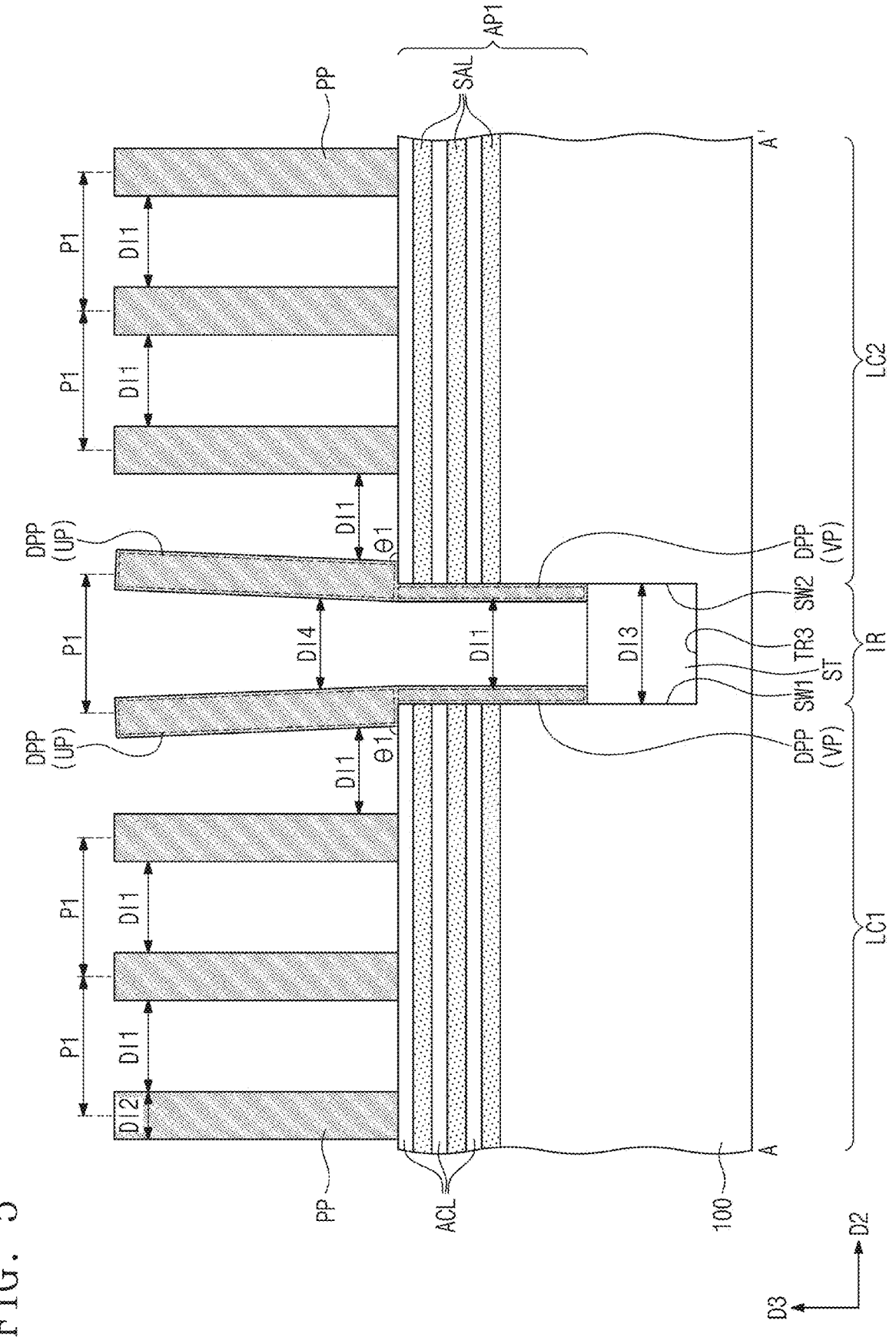
FIG. 5 is a sectional view taken along a line A-A' of FIG. 4.

FIG. 4 is a plan view illustrating sacrificial patterns, which are formed using the layout of FIG. 3. FIG. 5 is a sectional view taken along a line A-A' of FIG. 4. In detail, FIGS. 4 and 5 illustrate the sacrificial patterns, which are formed based on the layout of FIG. 3.

Referring to FIGS. 4 and 5, a first logic cell LC1 and a second logic cell LC2 may be provided on a substrate 100. The first and second logic cells LC1 and LC2 may be arranged in the second direction D2. The substrate 100 may include a PMOSFET region PR and an NMOSFET region NR. Each of the first and second logic cells LC1 and LC2 may include the PMOSFET and NMOSFET regions PR and NR extending in the second direction D2.

An isolation region IR may be disposed between the first and second logic cells LC1 and LC2. A third trench TR3 may be formed in the substrate 100 on the isolation region IR. The third trench TR3 may separate the first logic cell LC1 from the second logic cell LC2. The third trench TR3 may separate the second logic cell LC2 from the first logic cell LC1 in the second direction D2.

Sacrificial layers SAL and active layers ACL may be alternately stacked on the substrate 100. Each of the sacrificial and active layers SAL and ACL may be formed of or include at least one of silicon (Si), germanium (Ge), or silicon germanium (SiGe), but the material of the active layers ACL may be different from that of the sacrificial layers SAL.

A first active pattern AP1 may be provided on the PMOSFET region PR. A second active pattern AP2 may be provided on the NMOSFET region NR. Each of the first and second active patterns AP1 and AP2 may include the sacrificial layers SAL and the active layers ACL, which are alternately stacked in an upper portion thereof.

The third trench TR3 may divide each of the first active patterns AP1 into a pair of first active patterns AP1, which are adjacent to each other in the second direction D2. The third trench TR3 may divide each of the second active patterns AP2 into a pair of second active patterns AP2, which are adjacent to each other in the second direction D2. The third trench TR3 may include a first side surface SW1 and a second side surface SW2, which are respectively placed adjacent to the first logic cell LC1 and the second logic cell LC2. The first and second side surfaces SW1 and SW2 may face each other.

Sacrificial patterns PP and dummy sacrificial patterns DPP may be formed on the substrate 100 to cross the first and second active patterns AP1 and AP2. Each of the sacrificial patterns PP and the dummy sacrificial patterns DPP may be a line or bar shaped pattern, which is extended in the first direction D1. The sacrificial patterns PP and the dummy sacrificial patterns DPP may be arranged at the first pitch P1 in the second direction D2.

The dummy sacrificial patterns DPP may be respectively placed adjacent to the first and second side surfaces SW1 and SW2 of the third trench TR3. The dummy sacrificial patterns DPP may be disposed adjacent to the isolation region IR. The dummy sacrificial pattern DPP may include a body portion UP on the substrate 100 and a vertical portion VP, which is vertically and downwardly extended from the body portion UP along the first or second side surface SW1 or SW2 of the third trench TR3.

As a distance from the third trench TR3 increases, the body portion UP may be inclined at an angle to a top surface of the substrate 100. The body portion UP may be inclined toward the sacrificial pattern PP adjacent thereto. An angle between a side surface of the body portion UP and the top surface of the substrate 100 may be a first angle θ1. In an embodiment, the first angle θ1 may be an acute angle. As an example, the first angle θ1 may range from 60° to 85°.

A distance between the body portions UP of the dummy sacrificial patterns DPP, which are adjacent to each other, may be defined as a fourth distance DI4. The fourth distance DI4 may be increased in a third direction D3. The fourth distance DI4 may be larger than the first distance DI1. A distance between the vertical portions VP of the dummy sacrificial patterns DPP, which are adjacent to each other, may be substantially equal to the first distance DI1. The largest distance from the sacrificial patterns PP to the body portion UP of the dummy sacrificial pattern DPP adjacent thereto may be substantially equal to the first distance DI1.

Figures 6, 7:
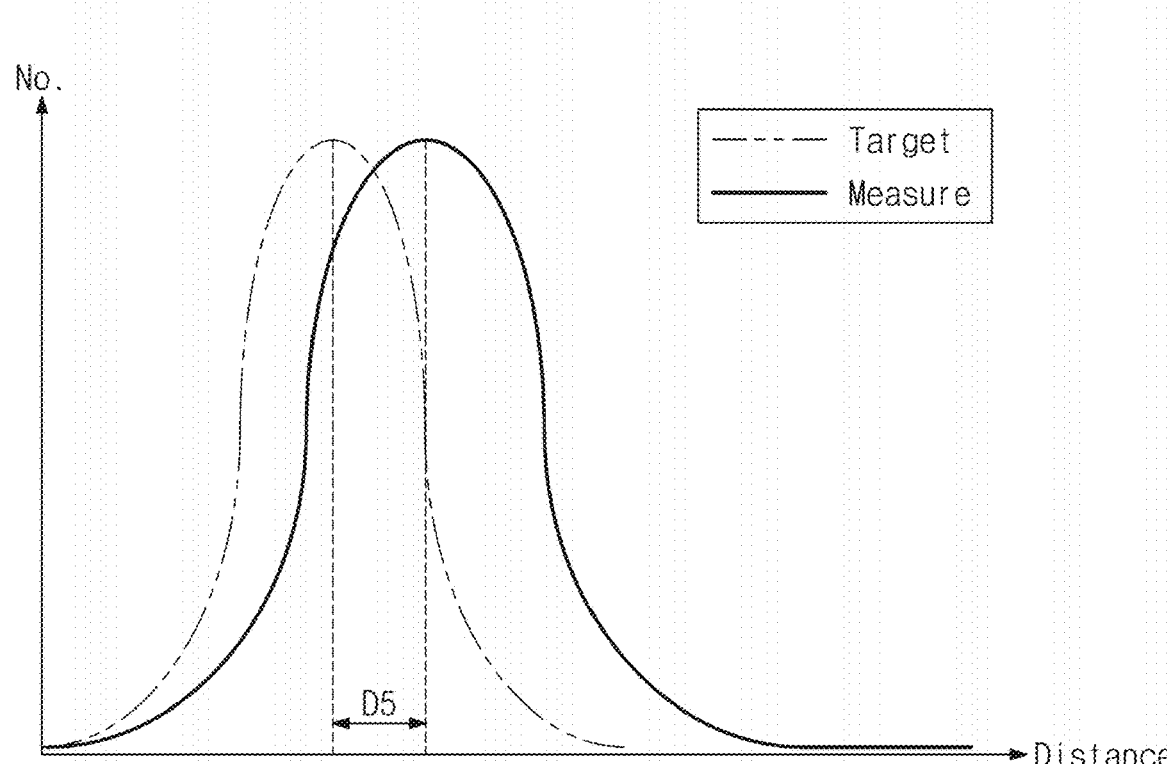
FIG. 6 is a flow chart concretely illustrating a second optical proximity correction operation of FIG. 2.
FIG. 7 is a graph showing normal distribution curves of a measured distance between sacrificial patterns and a target distance, according to an embodiment of inventive concepts.

FIG. 6 is a flow chart concretely illustrating the second OPC operation of FIG. 2.

The second OPC operation (in S70) may include measuring distances between sacrificial patterns and dummy sacrificial patterns, which are formed using the preliminary photomask (in S71). The measurement may be performed to obtain a large amount of data on distances between adjacent ones of the sacrificial patterns PP, between adjacent ones of the dummy sacrificial patterns DPP, and between the sacrificial pattern PP and the dummy sacrificial pattern DPP, which are adjacent to each other, near the third trench TR3, and in this case, a normal distribution curve may be obtained by plotting the obtained distance data.

To reduce complexity in the drawings, just two cutting patterns CPa are illustrated in FIG. 3, but the layout may include a number of the cutting patterns CPa. An image may be obtained from a large region, in which the sacrificial patterns PP formed using the layout are provided, and then, a plurality of data (e.g., millions to tens of millions) on distances between adjacent ones of the sacrificial patterns PP and the dummy sacrificial patterns DPP may be measured in the vicinity of a region corresponding to the cutting pattern CPa. Accordingly, it may be possible to improve the accuracy in the optical proximity correction, compared with the case that a small amount of data (e.g., tens to hundreds) on distances between adjacent ones of the sacrificial patterns PP and the dummy sacrificial patterns DPP are measured from an image for a specific region of a layout.

The measured distances may be compared with the target distance (in S72). FIG. 7 is a graph showing normal distribution curves of a measured distance between sacrificial patterns and a target distance, according to an embodiment of inventive concepts.

As shown in FIG. 7, a mean value of distances between adjacent ones of the sacrificial and dummy sacrificial patterns PP and DPP measured from the normal distribution curve may be shifted from a mean value of the target distances by a fifth distance DI5. Here, the target distances are ideal distance values between the sacrificial patterns PP and the dummy sacrificial patterns DPP, which are intended to be achieved in a fabrication process. In detail, the target distances may be distance values in an ideal structure, which does not have a problem to be described with reference to FIG. 13.

Figure 8:
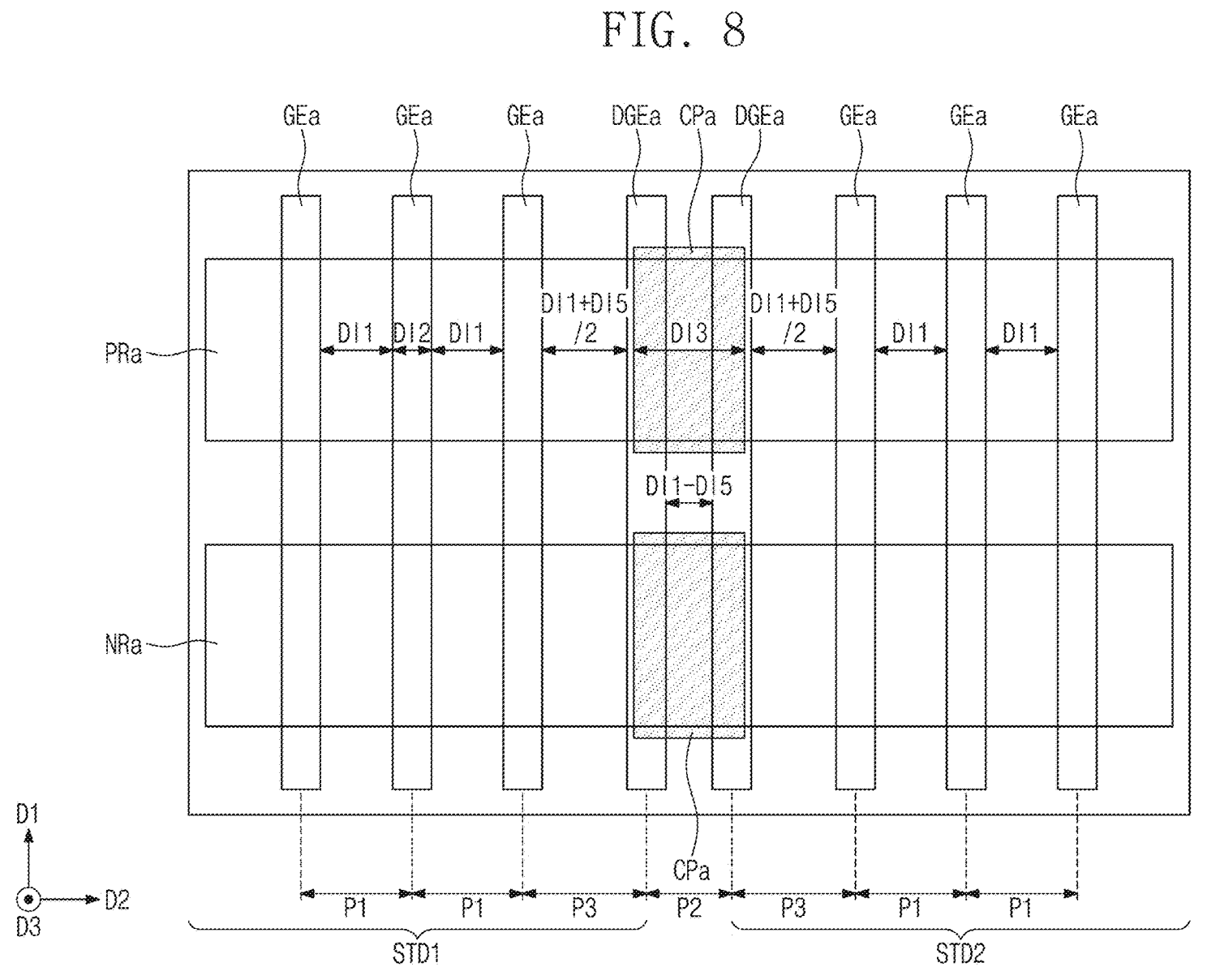

The layout may be biased by a parameter based on a relationship between a function of target distances and a function of distances between adjacent ones of sacrificial patterns. For example, in an embodiment, the layout may be biased by a difference between a mean value of target distances and a mean value of distances between adjacent ones of sacrificial patterns (in S73). FIG. 8 is a layout of a standard cell designed by the design method of FIG. 2. In detail, FIG. 8 may be a layout designed by the second OPC operation (in S70).

Referring to FIG. 8, a distance between adjacent ones of the dummy gate patterns DGEa may be reduced by the fifth distance DI5. For example, the second OPC operation may be performed on the layout of FIG. 3 such that a distance between the dummy gate patterns DGEa is reduced by the fifth distance DI5 (e.g., a difference from the target distance). Accordingly, the distance between the dummy gate patterns DGEa may be biased to a value of DI1-DI5. A distance between the dummy gate pattern DGEa and the gate pattern GEa adjacent thereto may be biased to a value of DI1+DI5/2. In other words, the dummy gate pattern DGEa disposed on the first standard cell STD1 may be biased toward the second standard cell STD2 by half of the fifth distance DI5 (e.g., DI5/2). The dummy gate pattern DGEa disposed on the second standard cell STD2 may be biased toward the first standard cell STD1 by half of the fifth distance DI5 (e.g., DI5/2).

A pitch between the dummy gate patterns DGEa may be biased to a second pitch P2. A pitch between the dummy gate pattern DGEa and the gate pattern GEa adjacent thereto may be biased to a third pitch P3. The second pitch P2 may be smaller than the first pitch P1. The third pitch P3 may be larger than the first pitch P1. The second pitch P2 may be smaller than the first pitch P1 by the fifth distance DI5. The third pitch P3 may be larger than the first pitch P1 by half of the fifth distance DI5 (e.g., DI5/2). In other words, the pitches may satisfy the formula of P2+2×P3=3×P1.

Figure 9:
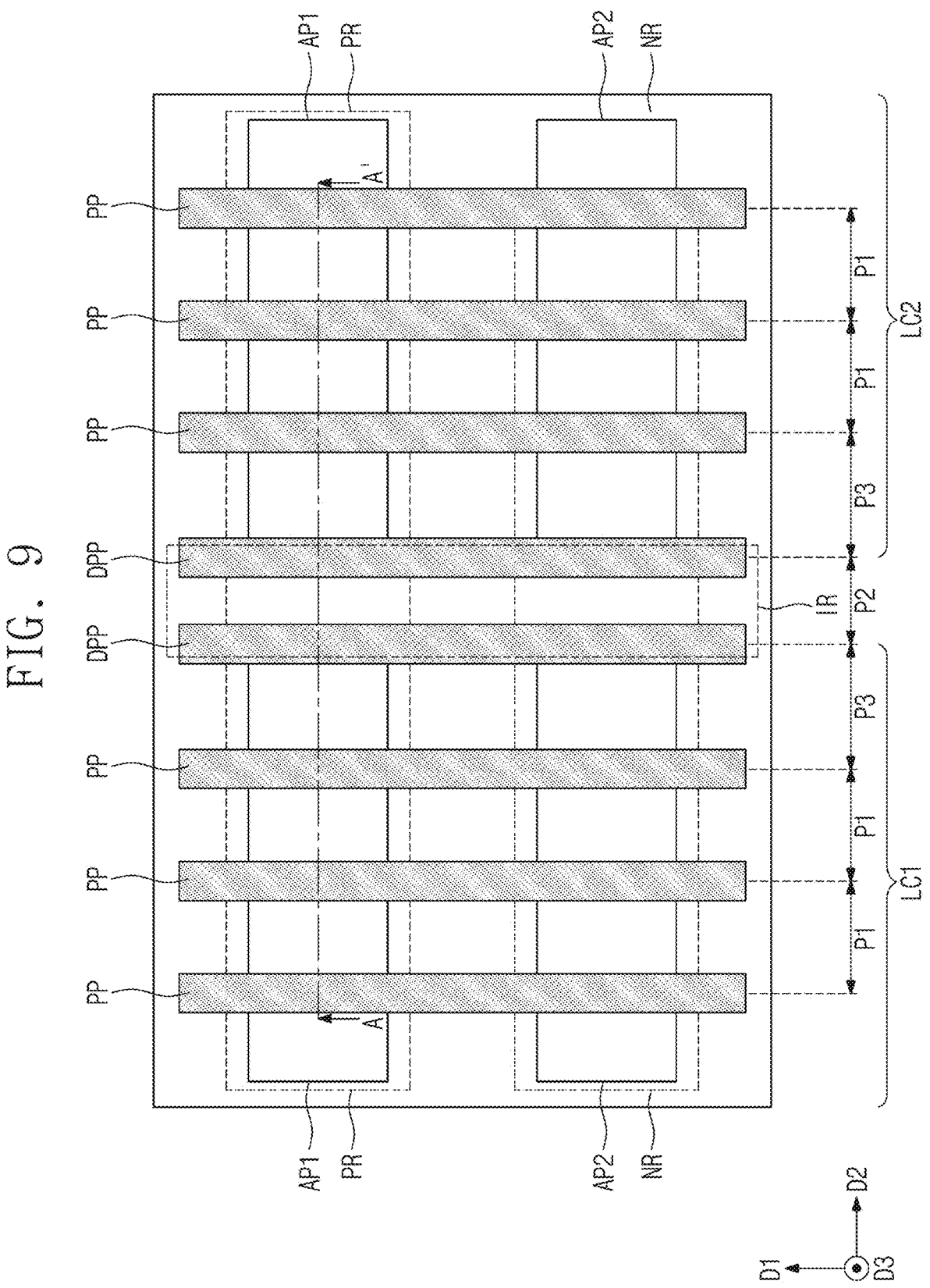
FIG. 9 is a plan view illustrating sacrificial patterns, which are formed using the layout of FIG. 8.
Figure 10:
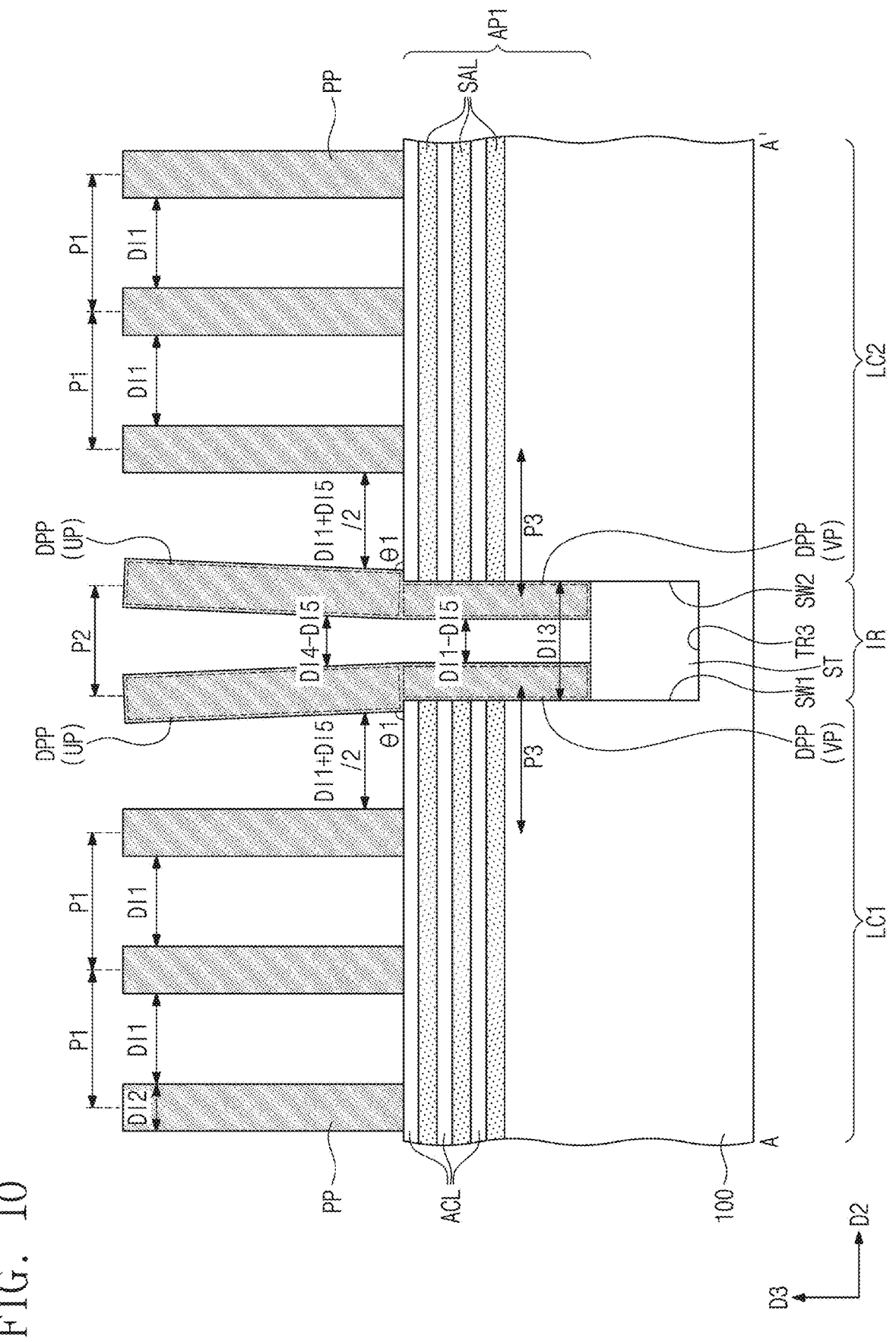
FIG. 10 is a sectional view taken along a line A-A' of FIG. 9.

FIG. 9 is a plan view illustrating sacrificial patterns, which are formed using the layout of FIG. 8. FIG. 10 is a sectional view taken along a line A-A' of FIG. 9. In detail, FIGS. 9 and 10 illustrate sacrificial patterns, which are formed based on the layout of FIG. 8.

Referring to FIGS. 9 and 10, a distance between the dummy sacrificial patterns DPP, which are adjacent to each other, may be reduced by the fifth distance DI5, and a distance between the dummy sacrificial pattern DPP and the sacrificial pattern PP adjacent thereto may be increased by half of the fifth distance DI5 (e.g., DI5/2), similar to that described with reference to FIG. 8. Here, a distance between the body portions UP of adjacent ones of the dummy sacrificial patterns DPP may be given by DI4-DI5, and the largest value of DI4-DI5 may be similar or equal to the first distance DI1.

According to an embodiment of inventive concepts, an OPC operation may be performed to reduce a distance between adjacent ones of the dummy gate patterns DGEa on a layout. Accordingly, it may be possible to limit and/or prevent a short circuit between an active contact and a dummy gate electrode, which may occur when the body portion UP of the dummy sacrificial patterns DPP is inclined toward the sacrificial pattern PP adjacent thereto and a distance between the dummy sacrificial patterns DPP and the sacrificial pattern PP is reduced. Furthermore, it may be possible to limit and/or prevent a short circuit between a dummy gate electrode and a gate electrode, which may occur when a recess between the dummy sacrificial pattern DPP and the sacrificial pattern PP is shallowly formed by a reduction in distance therebetween (e.g., see FIG. 13). As a result, it may be possible to improve electrical and reliability characteristics of a semiconductor device.

Figure 11:
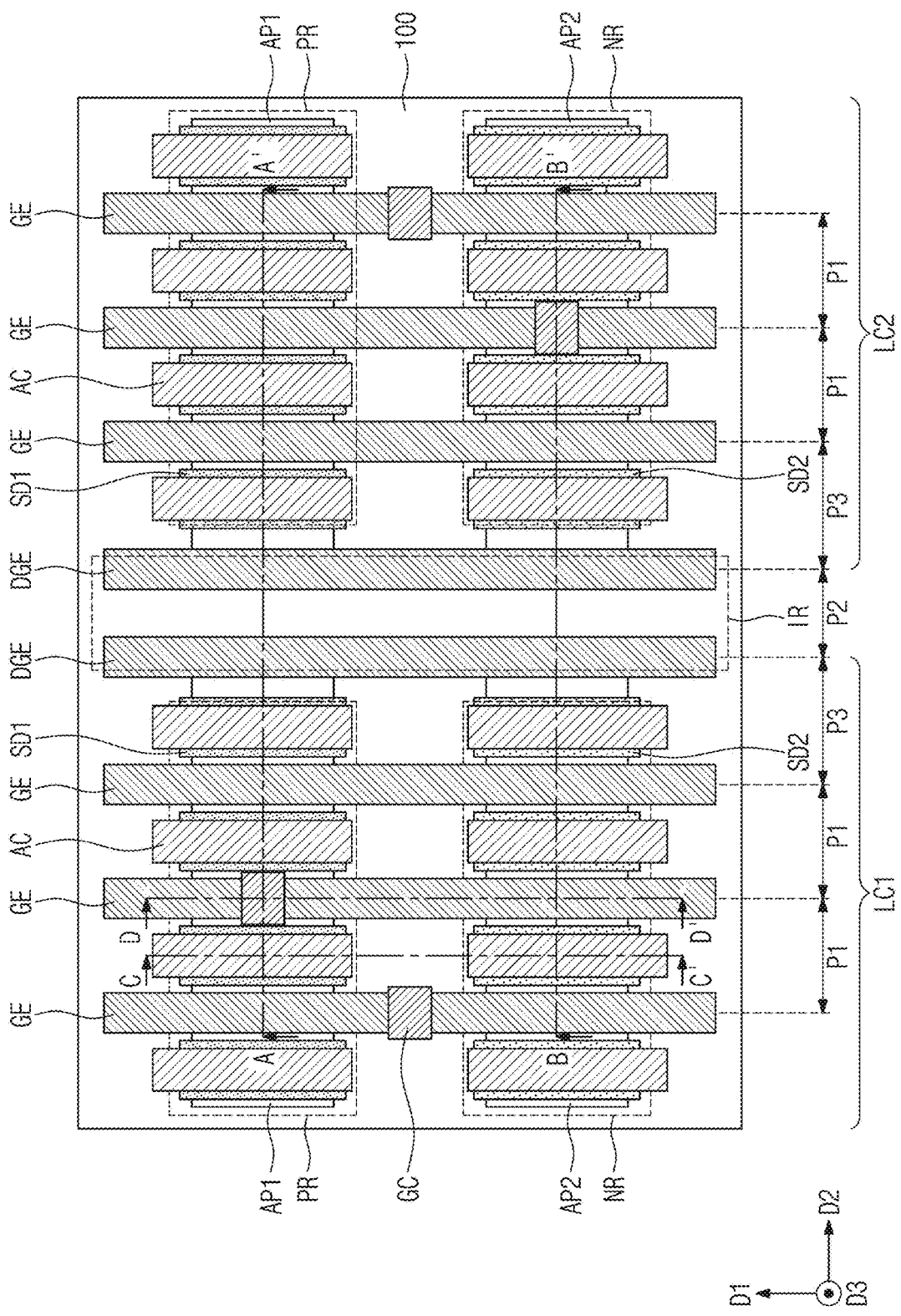
FIG. 11 is a plan view illustrating a semiconductor device according to an embodiment of inventive concepts.

FIG. 11 is a plan view illustrating a semiconductor device according to an embodiment of inventive concepts. FIGS. 12A to 12D are sectional views taken along lines A-A', B-B', C-C', and D-D', respectively, of FIG. 11. In detail, FIGS. 11 and 12A to 12D illustrate an example of semiconductor devices fabricated using the layout of FIG. 8.

Referring to FIGS. 11 and 12A to 12D, the first and second logic cells LC1 and LC2 may be provided on the substrate 100. The first and second logic cells LC1 and LC2 may be arranged in the second direction D2. Each of the first and second logic cells LC1 and LC2 may constitute a logic circuit. As an example, logic transistors constituting the logic circuit may be disposed on each of the first and second logic cells LC1 and LC2. In the present embodiment, the first and second logic cells LC1 and LC2 may include logic circuits, which are of the same kind of logic circuits or different kinds of logic circuits.

The substrate 100 may include the PMOSFET and NMOSFET regions PR and NR. Each of the first and second logic cells LC1 and LC2 may include the PMOSFET and NMOSFET regions PR and NR extending in the second direction D2. The substrate 100 may be a semiconductor substrate. For example, the substrate 100 may be a silicon wafer, a germanium wafer, or a silicon-on-insulator (SOI) wafer.

The PMOSFET and NMOSFET regions PR and NR may be defined by a second trench TR2, which is formed in an upper portion of the substrate 100. The second trench TR2 may be placed between the PMOSFET and NMOSFET regions PR and NR. The PMOSFET and NMOSFET regions PR and NR may be spaced apart from each other, in the first direction D1, with the second trench TR2 interposed therebetween.

The first and second active patterns AP1 and AP2 may be defined by a first trench TR1, which is formed in an upper portion of the substrate 100. The first and second active patterns AP1 and AP2 may be provided on the PMOSFET and NMOSFET regions PR and NR, respectively. The first trench TR1 may be shallower than the second trench TR2. The first and second active patterns AP1 and AP2 may be extended in the second direction D2. Each of the first and second active patterns AP1 and AP2 may be a vertically-protruding portion of the substrate 100.

The substrate 100 may include the isolation region IR between the first and second logic cells LC1 and LC2. The third trench TR3 may be formed in the substrate 100 on the isolation region IR. The third trench TR3 may separate the first logic cell LC1 from the second logic cell LC2. For example, the third trench TR3 may separate the second logic cell LC2 from the first logic cell LC1 in the second direction D2.

The third trench TR3 may divide each of the first active patterns AP1 into a pair of first active patterns AP1, which are adjacent to each other in the second direction D2. Also, the third trench TR3 may divide each of the second active patterns AP2 into a pair of second active patterns AP2, which are adjacent to each other in the second direction D2. The third trench TR3 may include the first side surface SW1 adjacent to the first logic cell LC1 and the second side surface SW2 adjacent to the second logic cell LC2. The first and second side surfaces SW1 and SW2 may face each other in the second direction D2, with the third trench TR3 interposed therebetween.

A device isolation layer ST may be provided to fill the first to third trenches TR1, TR2, and TR3. The device isolation layer ST may be formed of or include silicon oxide. Upper portions of the first and second active patterns AP1 and AP2 may protrude vertically above the device isolation layer ST. The device isolation layer ST may not cover the upper portions of the first and second active patterns AP1 and AP2.

The device isolation layer ST may cover lower side surfaces of the first and second active patterns AP1 and AP2. The device isolation layer ST may directly cover lower portions of the first and second side surfaces SW1 and SW2 of the third trench TR3.

The first active pattern AP1 may include an upper portion serving as a first channel pattern CH1. The second active pattern AP2 may include an upper portion serving as a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon germanium (SiGe). In an embodiment, each of the first to third semiconductor patterns SP1, SP2, and SP3 may be formed of or include crystalline silicon.

A plurality of first recesses RS1 may be formed in an upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second recesses RS2 may be formed in an upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. A top surface of each of the first and second source/drain patterns SD1 and SD2 may be located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) whose lattice constant is greater than that of the substrate 100. In this case, a pair of the first source/drain patterns SD1 may exert a compressive stress on the first channel patterns CH1 therebetween. The second source/drain patterns SD2 may be formed of or include the same semiconductor element (e.g., Si) as the substrate 100.

Dummy gate electrodes DGE may be respectively provided near the first and second side surfaces SW1 and SW2 of the third trench TR3. The dummy gate electrode DGE may be extended in the first direction D1 to cross the first and second active patterns AP1 and AP2. The dummy gate electrode DGE may be disposed adjacent to the isolation region IR. The dummy gate electrode DGE may not be connected to a gate contact GC, which will be described below.

The dummy gate electrode DGE may include a body portion UP on the substrate 100, a vertical portion VP, which is vertically extended from the body portion UP downward along the first or second side surface SW1 or SW2 of the third trench TR3, and protruding portions PT, which are extended from the vertical portion VP toward the first or second source/drain pattern SD1 or SD2 adjacent thereto. The protruding portions PT of the dummy gate electrode DGE adjacent to the PMOSFET region PR may be adjacent to the first source/drain pattern SD1. The protruding portions PT of the dummy gate electrode DGE adjacent to the NMOSFET region NR may be adjacent to inner spacer IP, which will be described below.

Dummy gate spacers DGS may be provided on opposite side surfaces of the dummy gate electrode DGE. The dummy gate spacer DGS may be formed of or include the same material as a gate spacer GS, which will be described below. One of the dummy gate spacers DGS on the dummy gate electrode DGE may be vertically extended along the first or second side surface SW1 or SW2 of the third trench TR3 to be in contact with a top surface of the device isolation layer ST.

A dummy gate insulating layer DGI may be interposed between the dummy gate electrode DGE and the first channel pattern CH1 and between the dummy gate electrode DGE and the second channel pattern CH2. The dummy gate insulating layer DGI may be formed of or include the same material as a gate insulating layer GI, which will be described below.

Gate electrodes GE may be provided to cross the first and second active patterns AP1 and AP2 and to extend in the first direction D1. Each of the gate electrodes GE may be vertically overlapped with the first and second channel patterns CH1 and CH2. The gate electrodes GE may be spaced apart from the dummy gate electrode DGE in the first direction D1.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 12A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 12D, the gate electrode GE may be provided on a top surface TS, a bottom surface BS, and opposite side surfaces SIW of each of the first to third semiconductor patterns SP1, SP2, and SP3. In other words, the logic transistor according to the present embodiment may be a three-dimensional field-effect transistor (e.g., a multi-bridge channel field-effect transistor (MBCFET), in which the gate electrode GE is provided to three-dimensionally surround the channel pattern.

Referring back to FIGS. 11 and 12A to 12D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may have a multi-layered structure, which includes at least two different materials selected from SiCN, SiCON, and SiN.

A gate capping pattern GP may be provided on each of the gate electrode GE and the dummy gate electrode DGE. The gate capping pattern GP may be extended in the first direction D1 and along the gate electrode GE or the dummy gate electrode DGE. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the side surfaces SIW of each of the first to third semiconductor patterns SP1, SP2, and SP3. The gate insulating layer GI may cover a top surface of the device isolation layer ST below the gate electrode GE (e.g., see FIG. 12D).

In an embodiment, each of the gate insulating layer GI and the dummy gate insulating layer DGI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, each of the gate insulating layer GI and the dummy gate insulating layer DGI may include a ferroelectric layer exhibiting a ferroelectric property and a paraelectric layer exhibiting a paraelectric property.

The ferroelectric layer may have a negative capacitance. The paraelectric layer may have a positive capacitance. In the case where two or more capacitors are connected in series and each capacitor has a positive capacitance, a total capacitance may be less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS) less than 60 mV/decade, at the room temperature.

The ferroelectric layer may have a ferroelectric material property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have a paraelectric material property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts is not limited to these examples.

The ferroelectric layer and the paraelectric layer may be formed of or include the same material. The ferroelectric layer may have the ferroelectric material property, but the paraelectric layer may not have the ferroelectric material property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric material property, only when it is in a specific range of thickness. In an embodiment, the ferroelectric layer may have a thickness ranging from 0.5 to 10 nm, but inventive concepts is not limited to this example. Since a critical thickness associated with the occurrence of the ferroelectric material property varies depending on the kind of the ferroelectric material, the thickness of the ferroelectric layer may be changed depending on the kind of the ferroelectric material.

In an embodiment, each of the gate insulating layer GI and the dummy gate insulating layer DGI may include a single ferroelectric layer. In another embodiment, each of the gate insulating layer GI and the dummy gate insulating layer DGI may include a plurality of ferroelectric layers spaced apart from each other. In other embodiment, each of the gate insulating layer GI and the dummy gate insulating layer DGI may have a stacking structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal. The dummy gate electrode DGE may have a structure that is substantially the same as or similar to the gate electrode GE.

The first metal pattern may include a metal nitride layer. For example, the first metal pattern may be formed of or include at least one metallic material, which is selected from the group consisting of titanium (Ti), tantalum (Ta), aluminum (Al), tungsten (W) and molybdenum (Mo), and nitrogen (N). Furthermore, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A pitch between adjacent ones of the gate electrodes GE may be the first pitch P1. A pitch between adjacent ones of the dummy gate electrodes DGE may be the second pitch P2. A pitch between the gate electrode GE and the dummy gate electrode DGE adjacent thereto may be the third pitch P3. The second pitch P2 may be smaller than the first pitch P1. The third pitch P3 may be larger than the first pitch P1. Here, the pitches may satisfy the formula of P2+2×P3=3× P1. The first to third pitches P1, P2, and P3 may be substantially equal to those described with reference to FIGS. 8 to 10.

A distance between adjacent ones of the gate electrodes GE may be a first width W1. A width of the gate electrode GE may be a second width W2. A width of the third trench TR3 may be a third width W3. A distance between adjacent ones of the dummy gate electrodes DGE may be a fourth width W4. The largest distance between the gate electrode GE and the dummy gate electrode DGE, which are adjacent to each other, may be a fifth width W5.

The fifth width W5 may be larger than the first width W1. The third width W3 may be substantially equal to the first pitch P1. The fourth width W4 may be smaller than the first width W1.

A width of the body portion UP of the dummy gate electrode DGE may be substantially equal to the second width W2. A width of the vertical portion VP of the dummy gate electrode DGE may be a sixth width W6. The sixth width W6 may be smaller than the second width W2. In detail, the sixth width W6 may be larger than half of the second width W2 and may be smaller than the second width W2.

The body portion UP of the dummy gate electrode DGE may be inclined toward the first or second source/drain patterns SD1 or SD2 adjacent thereto. An angle between a side surface of the body portion UP and a top surface of the substrate 100 may be a first angle θ1. In an embodiment, the first angle θ1 may be an acute angle. As an example, the first angle θ1 may range from 60° to 85°.

Referring back to FIG. 12B, inner spacers IP may be provided on the NMOSFET region NR. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The inner spacer IP may be formed of or include at least one of low-k dielectric materials. The low-k dielectric materials may include silicon oxide or dielectric materials whose dielectric constants are lower than that of silicon oxide. For example, the low-k dielectric materials may include silicon oxide, fluorine- or carbon-doped silicon oxide, porous silicon oxide, or organic polymeric dielectric materials.

A first interlayer insulating layer 110 may be provided on the substrate 100. The first interlayer insulating layer 110 may cover the gate spacers GS, the dummy gate spacers DGS, and the first and second source/drain patterns SD1 and SD2. A top surface of the first interlayer insulating layer 110 may be substantially coplanar with a top surface of the gate capping pattern GP, a top surface of the dummy gate spacer DGS, and a top surface of the gate spacer GS. A second interlayer insulating layer 120 may be formed on the first interlayer insulating layer 110 to cover the gate capping pattern GP. In an embodiment, at least one of the first and second interlayer insulating layers 110 and 120 may include a silicon oxide layer.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern extended in the first direction D1. The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. Although not shown, the active contact AC may cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, or cobalt silicide).

A gate contact GC may be provided to penetrate the second interlayer insulating layer 120 and the gate capping pattern GP and to be electrically connected to the gate electrode GE. Referring to FIG. 12B, an upper region of each of the active contacts AC adjacent to the gate contact GC may be filled with an upper insulating pattern UIP. Accordingly, it may be possible to limit and/or prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. The conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include first interconnection lines M1_I and first vias VI1. Each of the first interconnection lines M1_I may be a line or bar-shape pattern that is extended in the second direction D2. The first vias VI1 may be provided below the first interconnection lines M1_I. The first vias VI1 may be respectively interposed between the active contacts AC and the first interconnection lines M1_I. The first vias VI1 may be respectively interposed between the gate contacts GC and the first interconnection lines M1_I.

The first interconnection lines M1_I of the first metal layer M1 and the first via VI1 thereunder may be separately formed by different processes. In other words, each of the first interconnection line M1_I and the first via VI1 may be formed by a single damascene process. The semiconductor device according to the present embodiment may be fabricated using a sub-20 nm process.

A second metal layer M2 may be provided in a fourth interlayer insulating layer 140. The second metal layer M2 may include second interconnection lines M2_I. Each of the second interconnection lines M2_I may be a line- or bar-shaped pattern that is extended in the first direction D1.

The second metal layer M2 may further include second vias VI2. The second vias VI2 may be provided below the second interconnection lines M2_I. The second vias VI2 may be respectively interposed between the first interconnection lines M1_I and the second interconnection lines M23.

The second interconnection line M2_I of the second metal layer M2 and the second via VI2 thereunder may be formed by the same process, and in this case, they may constitute a single object. For example, the second interconnection line M2_I and the second via VI2 of the second metal layer M2 may be formed together by a dual damascene process.

The first interconnection lines M1_I of the first metal layer M1 and the second interconnection lines M2_I of the second metal layer M2 may be formed of or include the same conductive material or different conductive materials. For example, the first interconnection lines M1_I and the second interconnection lines M2_I may be formed of or include at least one of metallic materials (e.g., aluminum, copper, tungsten, molybdenum, or cobalt).

In an embodiment, although not shown, additional metal layers (e.g., M3, M4, M5, and so forth) may be further stacked on the fourth interlayer insulating layer 140. Each of the stacked metal layers may include routing lines.

Figure 12A:
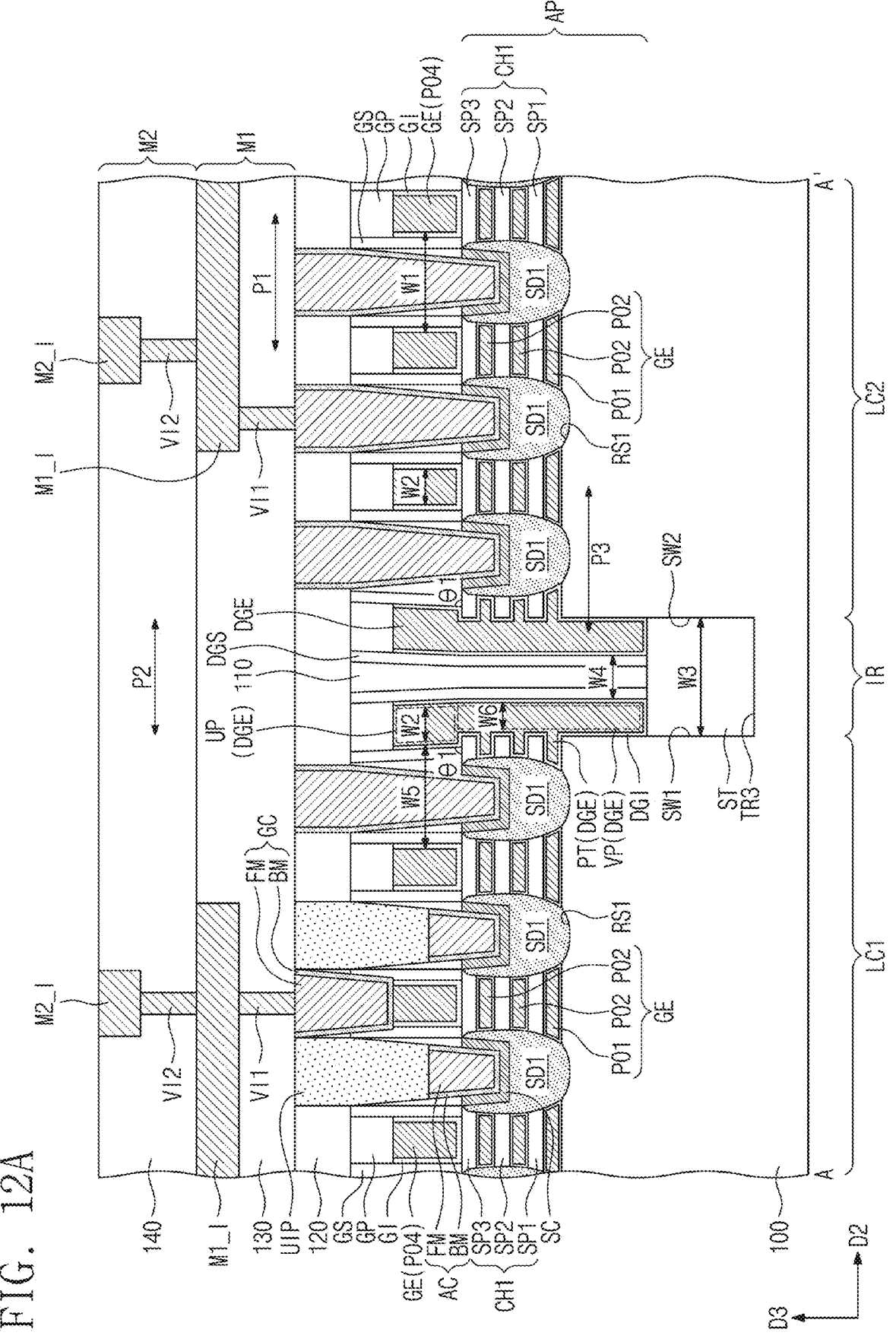
FIGS. 12A to 12D are sectional views taken along lines A-A', B-B', C-C', and D-D', respectively, of FIG. 11.
Figure 12B:
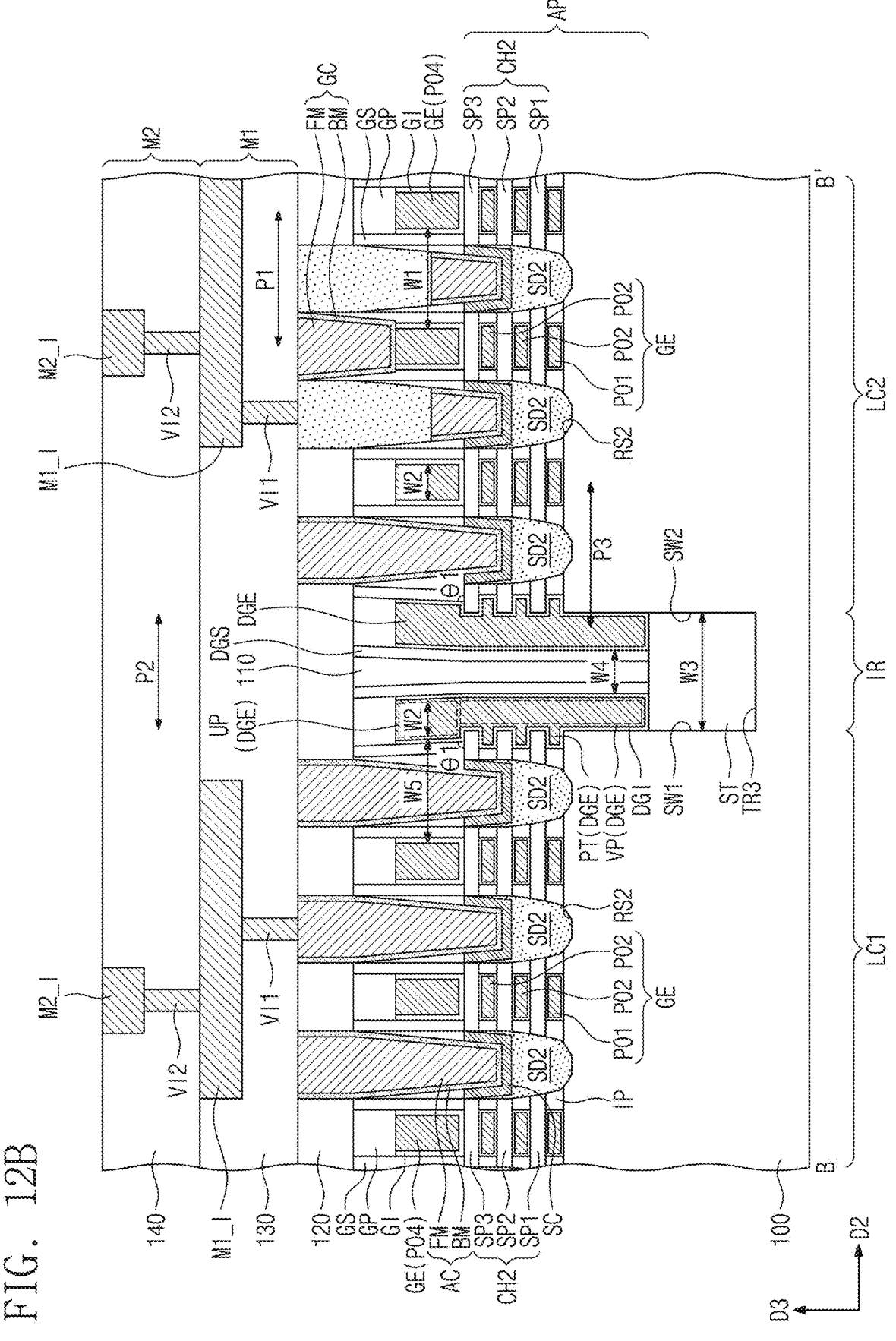
Figure 12C:
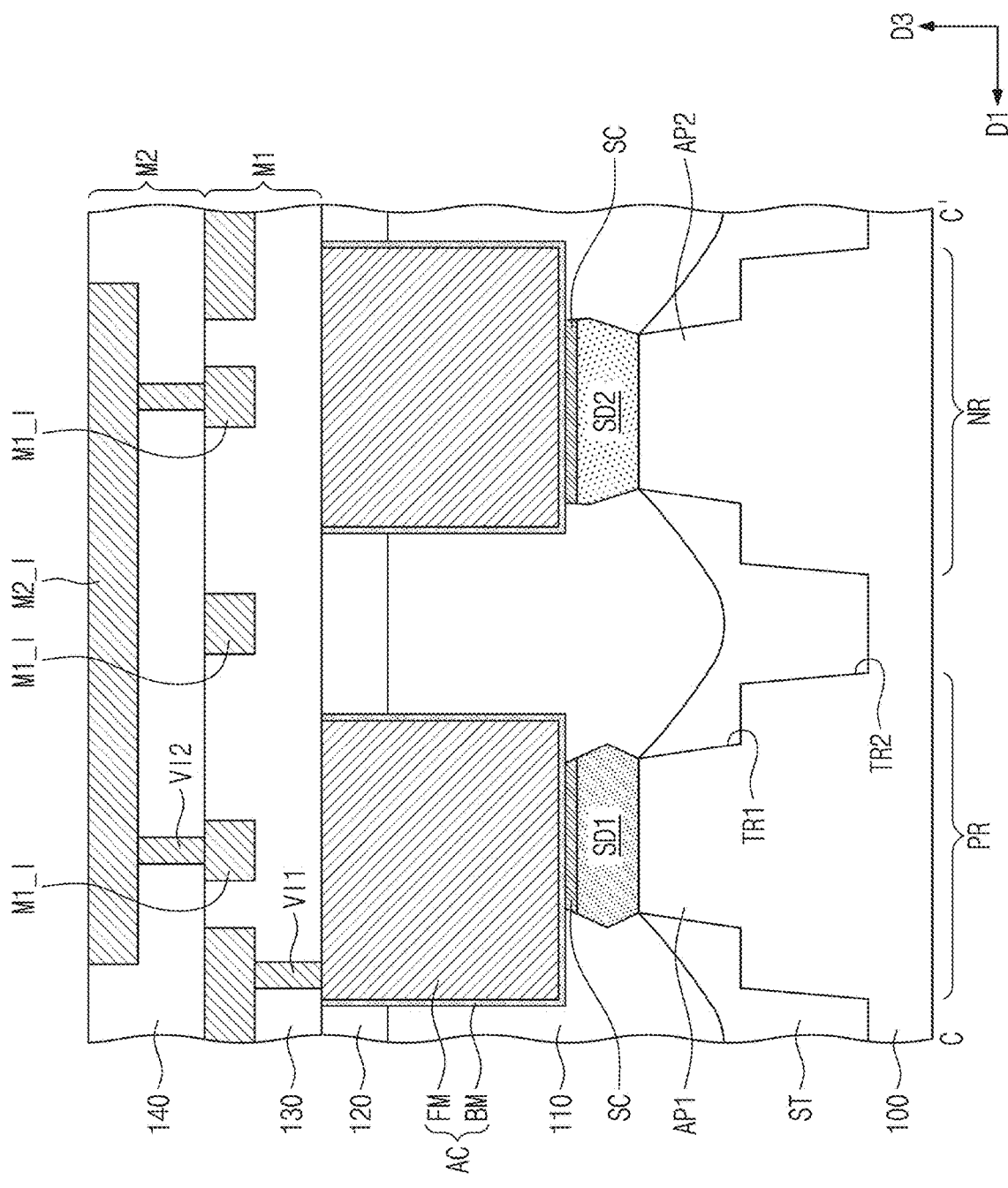
Figure 12D:
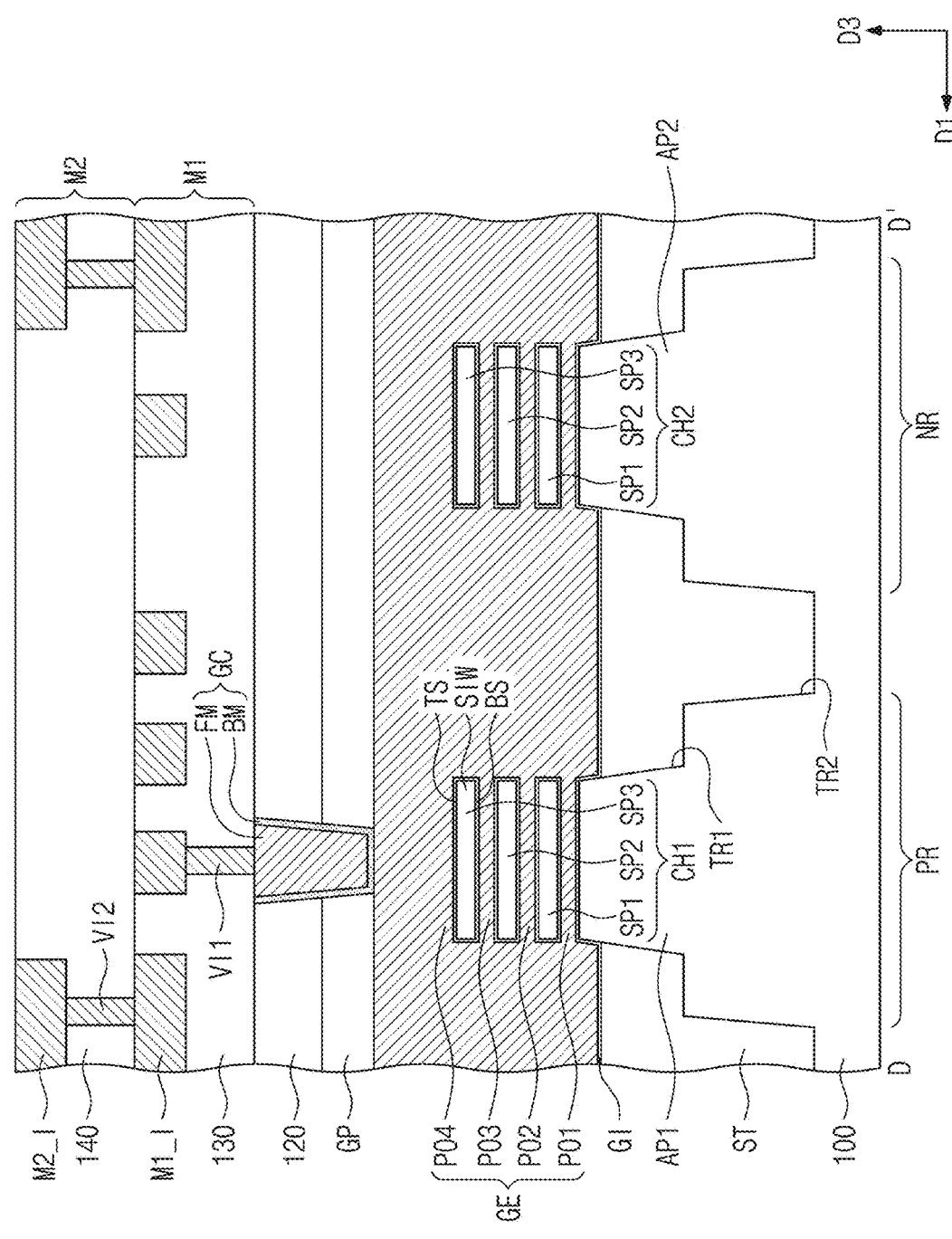
Figure 13:
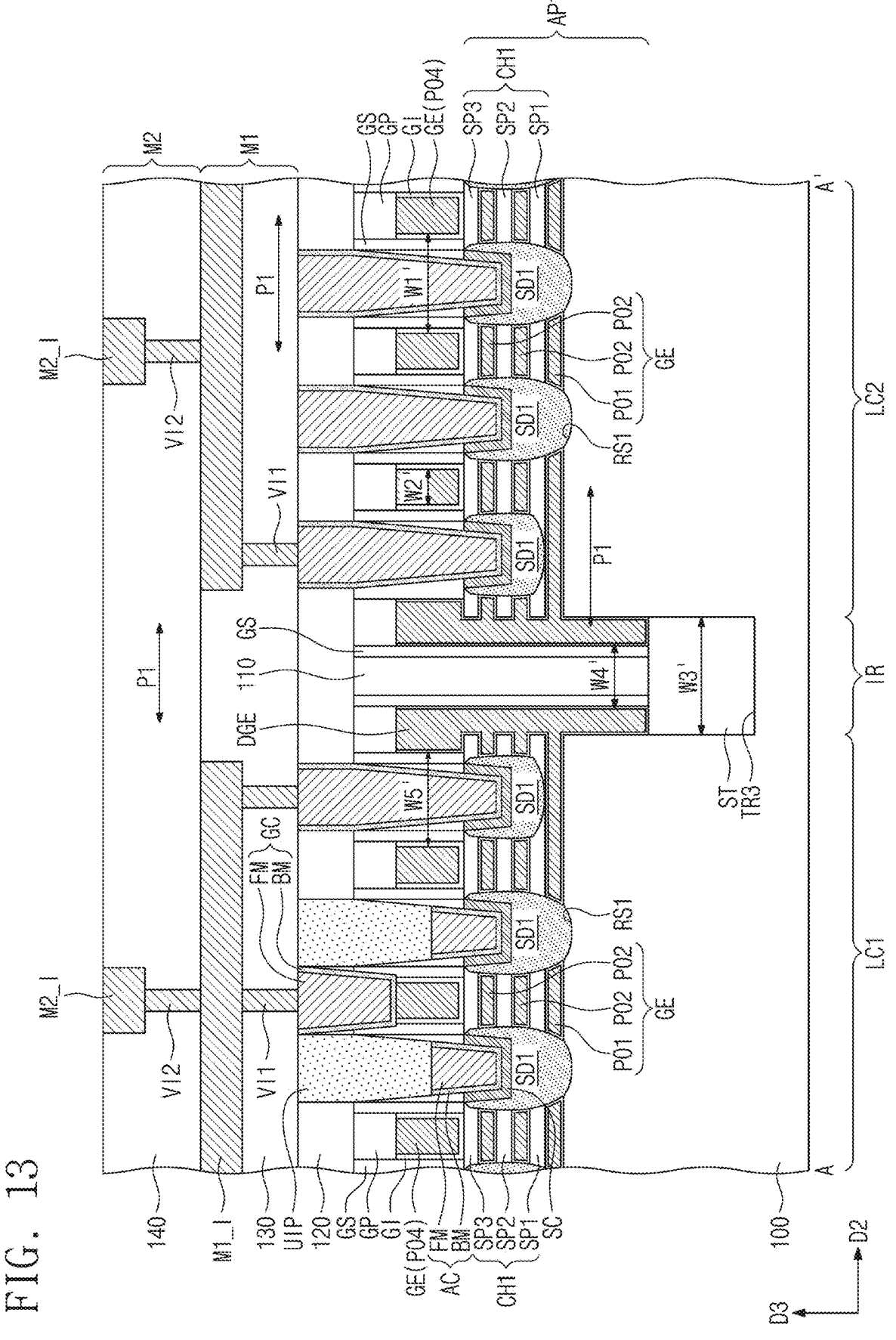
FIG. 13 is a sectional view taken along a line A-A' of FIG. 11 to illustrate a semiconductor device according to a comparative example.

FIG. 13 is a sectional view taken along a line A-A' of FIG. 11 to illustrate a semiconductor device according to a comparative example. In the following description of the comparative example, an element previously described with reference to FIGS. 11 and 12A to 12D may be identified by the same reference number without repeating an overlapping description thereof, for concise description. In detail, FIG. 13 illustrates a portion of a semiconductor device fabricated based on the layout of FIG. 3.

Referring to FIGS. 11 and 13, a distance between adjacent ones of the gate electrodes GE may be a first width W1'. A width of the gate electrode GE may be a second width W2'. A width of the third trench TR3 may be a third width W3'. A distance between adjacent ones of the dummy gate electrodes DGE may be a fourth width W4'. A distance between the dummy gate electrode DGE and the gate electrode GE adjacent thereto may be a fifth width W5'.

The first width W1' of FIG. 13 may be substantially equal to the first width W1 of FIG. 12A. The second width W2' of FIG. 13 may be substantially equal to the second width W2 of FIG. 12A. The third width W3' of FIG. 13 may be substantially equal to the third width W3 of FIG. 12A. The fourth width W4' of FIG. 13 may be larger than the fourth width W4 of FIG. 12A. The fifth width W5' of FIG. 13 may be smaller than the fifth width W5 of FIG. 12A. That is, a distance between the dummy gate electrode DGE and the gate electrode GE adjacent thereto may be smaller in the semiconductor device of FIG. 13 than in the semiconductor device of FIG. 12A.

As a semiconductor device is scaled down, the sacrificial pattern PP and the dummy sacrificial pattern DPP may be formed to have an increased aspect ratio, and this may lead to a leaning issue of the dummy sacrificial pattern DPP adjacent to the third trench TR3 (e.g., see FIG. 5). In the case where the dummy sacrificial pattern DPP has the leaning issue, the dummy gate electrode DGE may also be formed to have a leaning structure, which causes a short circuit issue between the dummy gate electrode DGE and the active contact AC adjacent thereto.

Furthermore, the first source/drain pattern SD1 near the third trench TR3 may be thinner than the others. For example, the leaning structure of the dummy sacrificial pattern DPP adjacent to the third trench TR3 may result in a reduction of an area of a region that is exposed during a process of forming the first recess RS1, and thus, the first recess RS1 may not be formed to a desired depth. In this case, the thinning issue of the first source/drain pattern SD1 may occur, and moreover, the gate electrodes GE, which are adjacent to each other, may not be separated from each other. This may result in a malfunction and failure of a semiconductor device. As a result, the reliability and electrical characteristics of the semiconductor device may be deteriorated.

According to an embodiment of inventive concepts, a distance between adjacent ones of dummy gate patterns may be reduced by an OPC operation, which is performed based on comparison with the target distances desired and/or alternative predetermined in the layout design operation. Accordingly, even when a final structure of a dummy gate electrode is inclined, it may be possible to limit and/or prevent a short circuit from being formed between the dummy gate electrode and an active contact adjacent thereto. In addition, it may be possible to limit and/or prevent a short circuit between the dummy gate electrode and a gate electrode, which may occur when a distance between a dummy sacrificial pattern and a sacrificial pattern is reduced and consequently a recess therebetween is formed to a small depth. As a result, it may be possible to improve electrical and reliability characteristics of a semiconductor device.

Figure 21A:
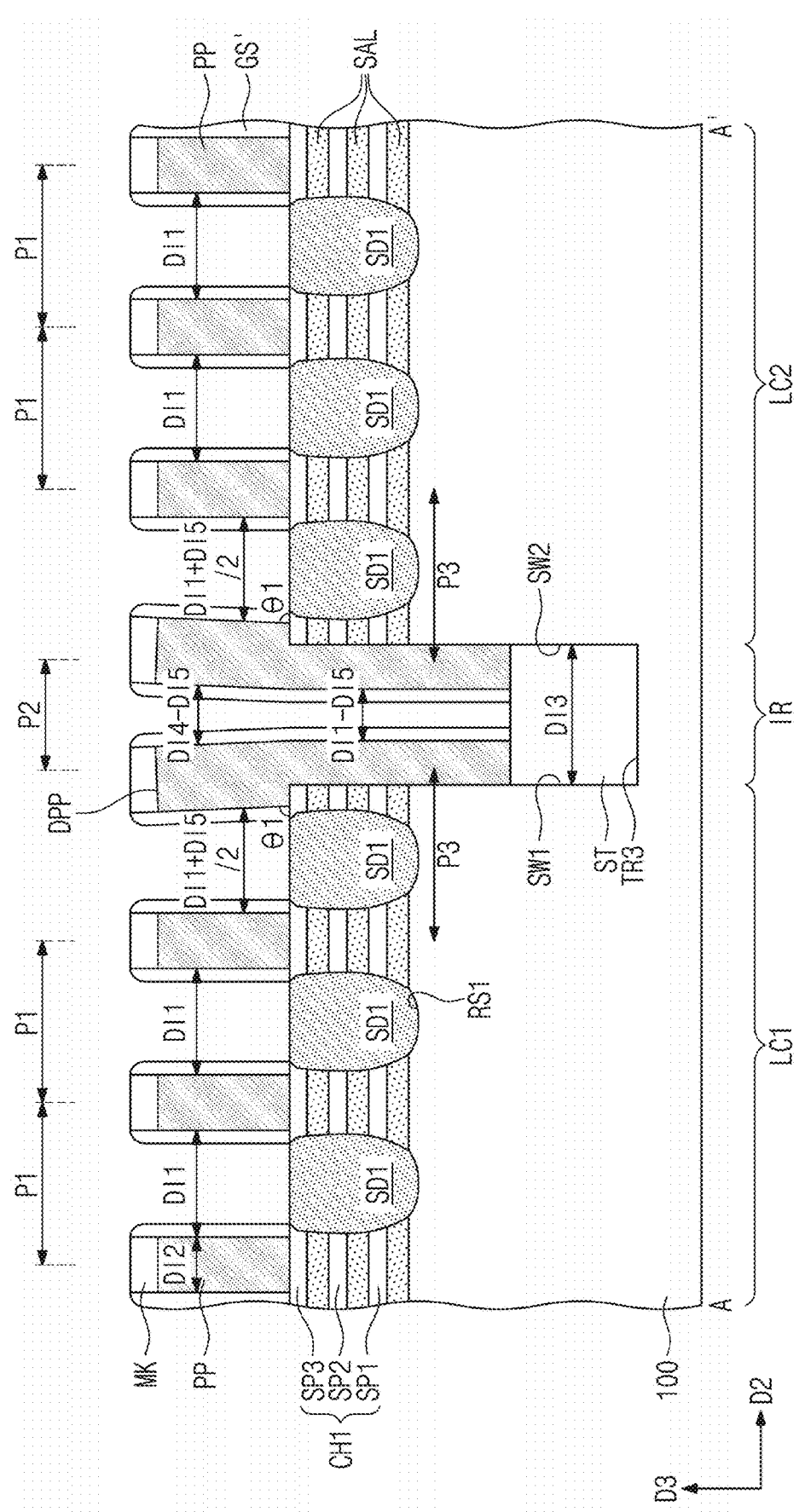
Figure 21B:
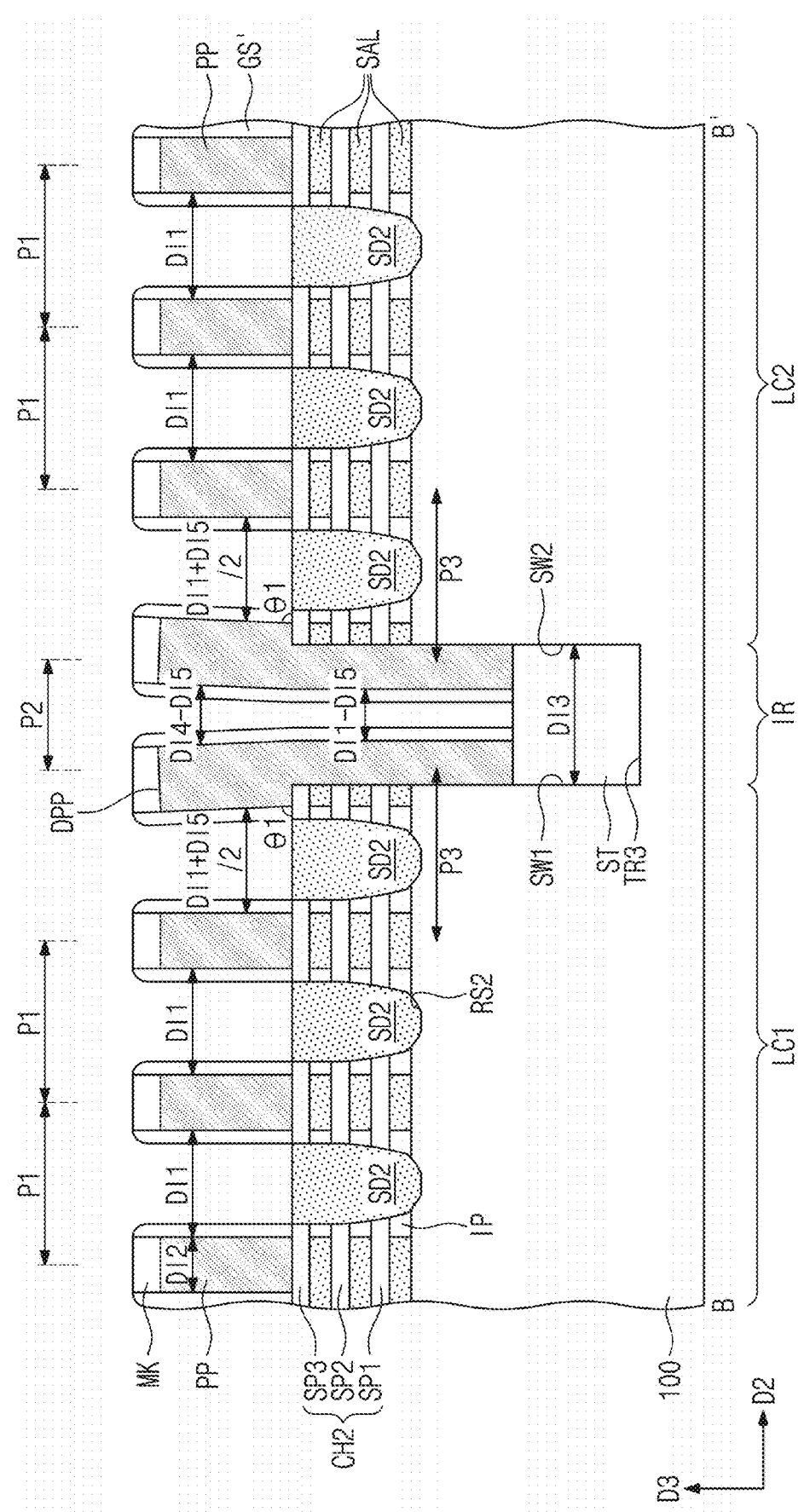
Figure 21C:
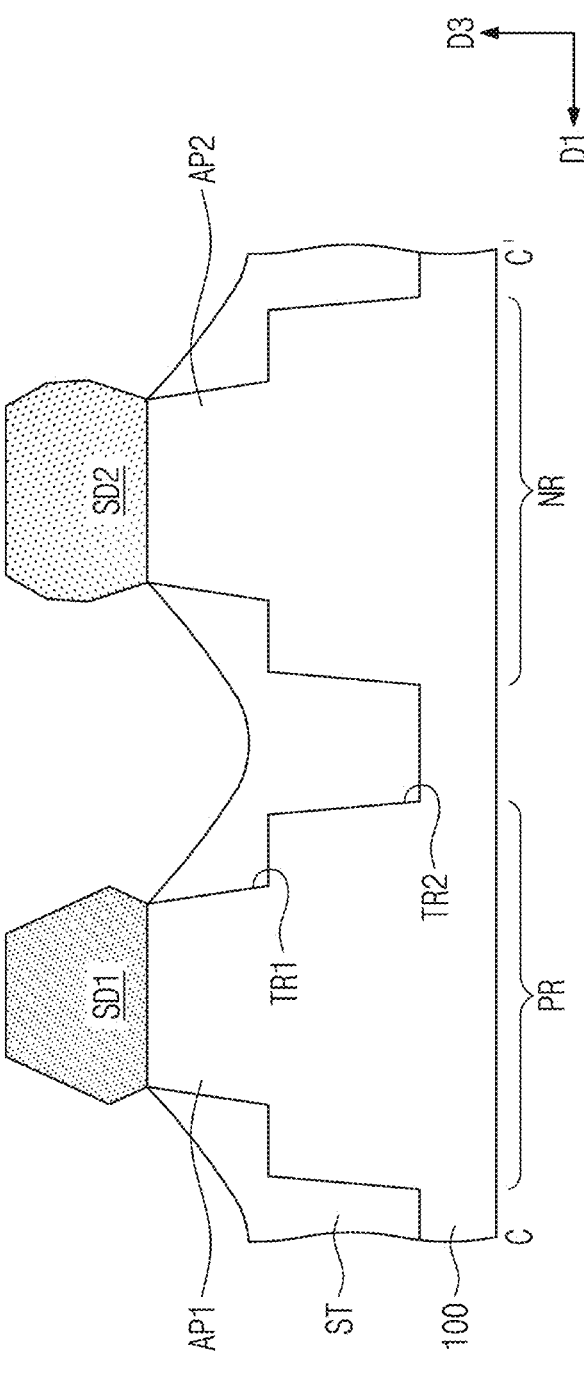
FIGS. 21C and 23C are sectional views taken along lines C-C' of FIGS. 20 and 22, respectively.
Figure 21D:
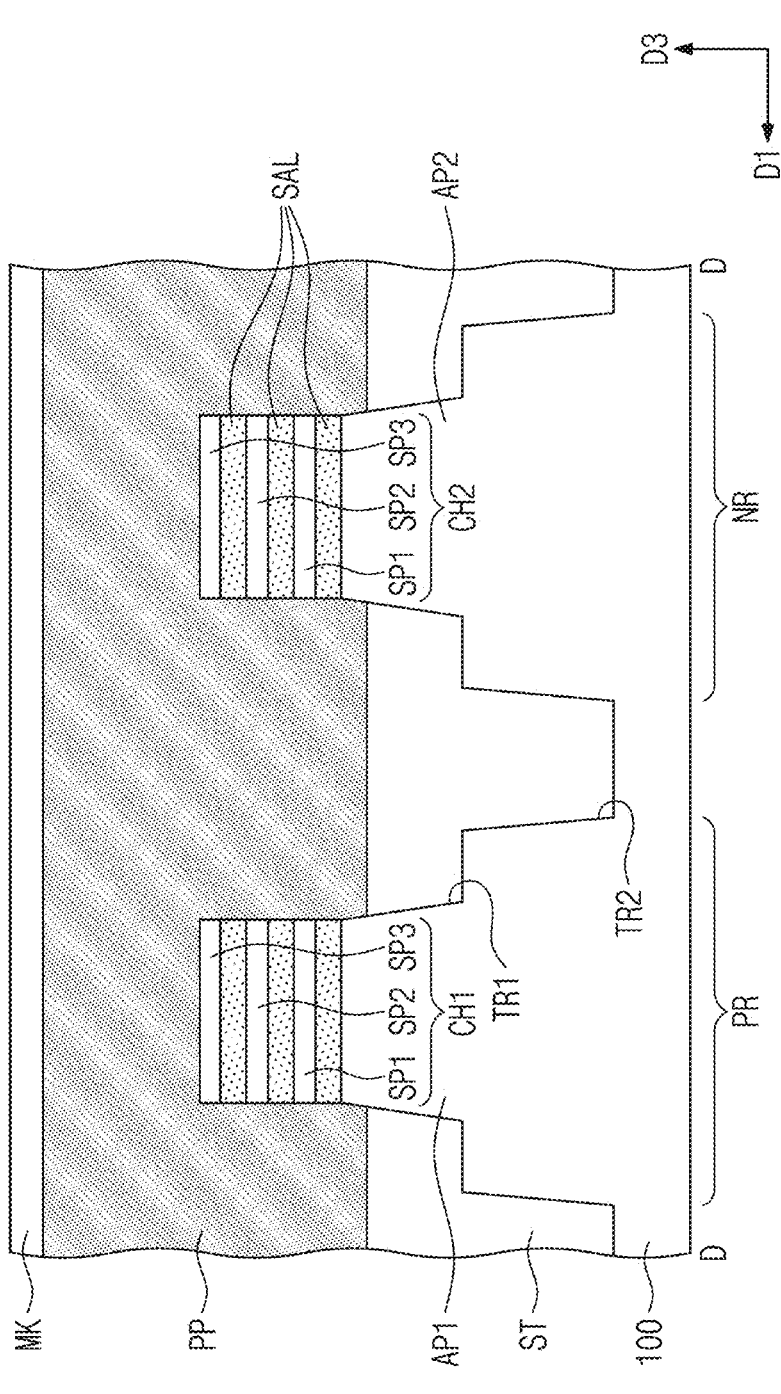
FIGS. 21D, 23D, and 25C are sectional views taken along lines D-D' of FIGS. 20, 22, and 24, respectively.
Figure 22:
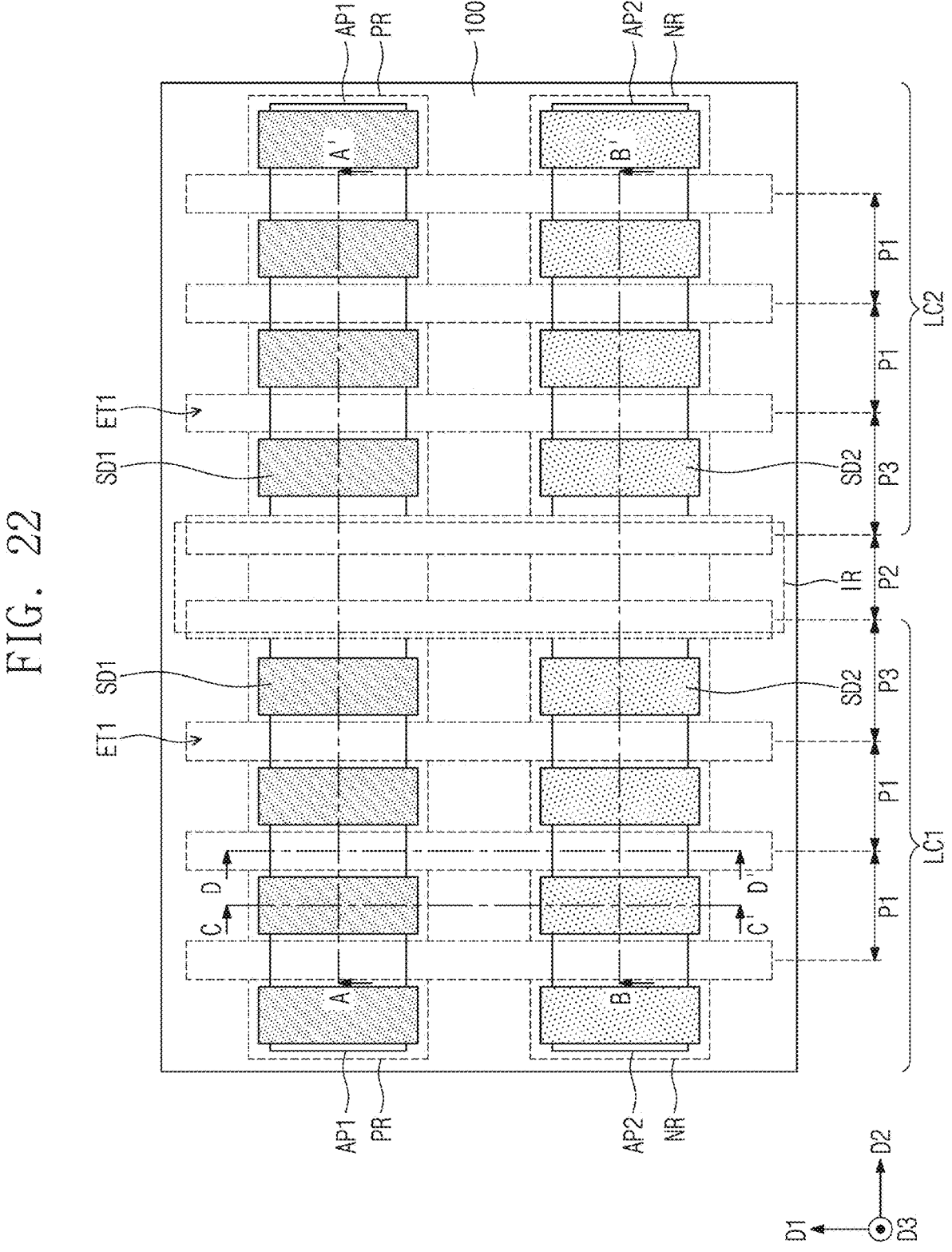
Figure 23A:
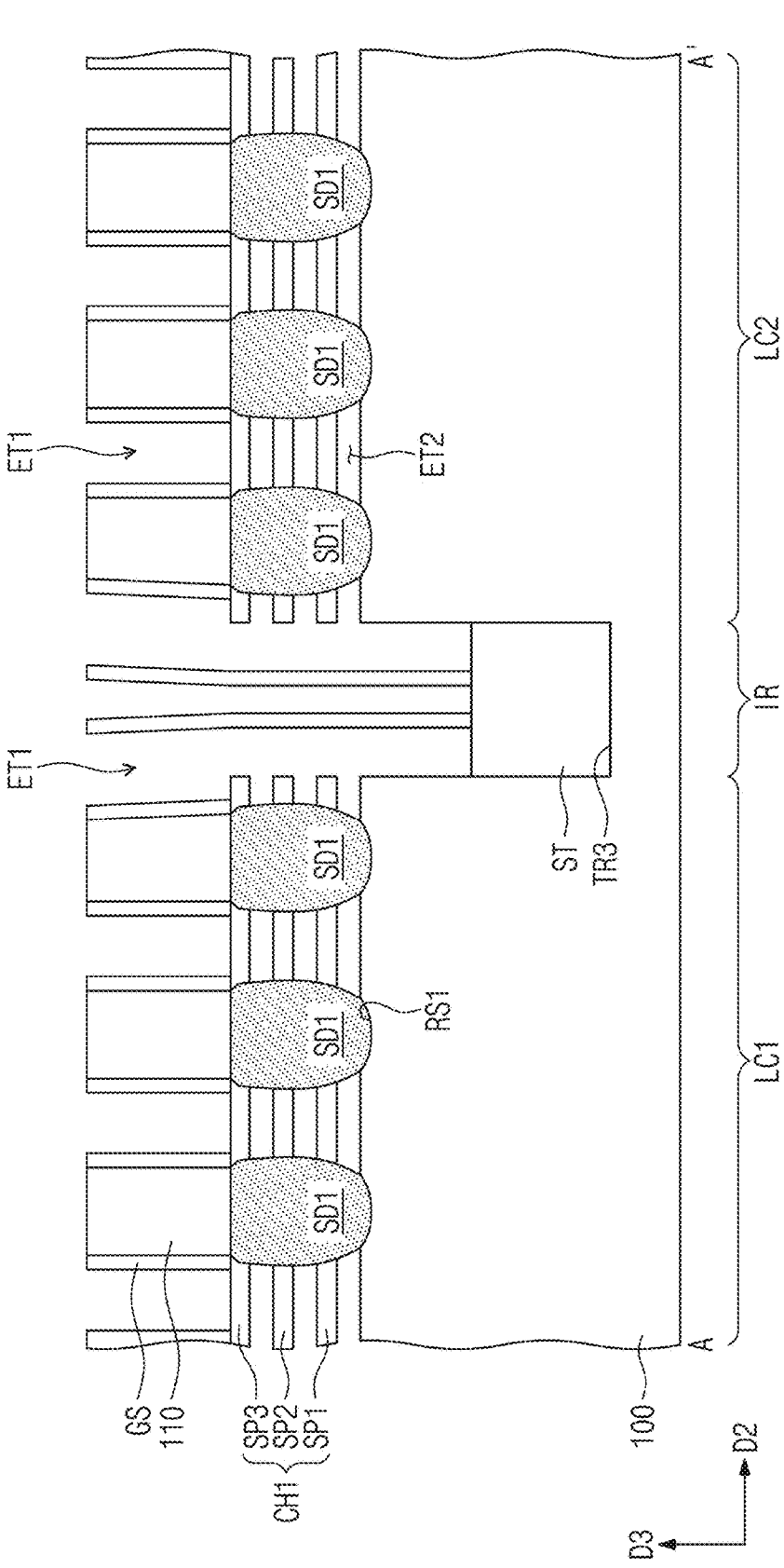
Figure 23B:
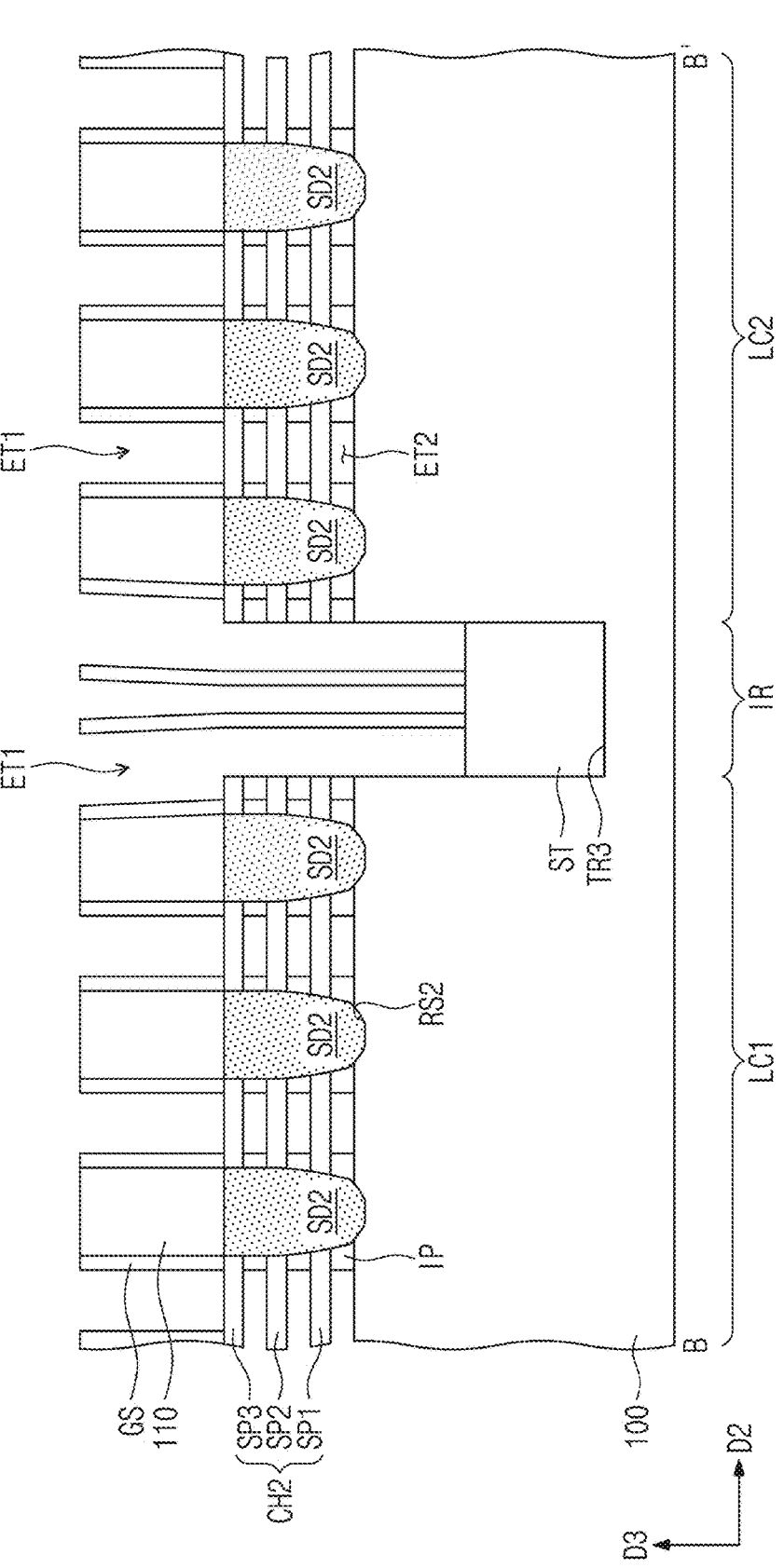
Figure 23C:
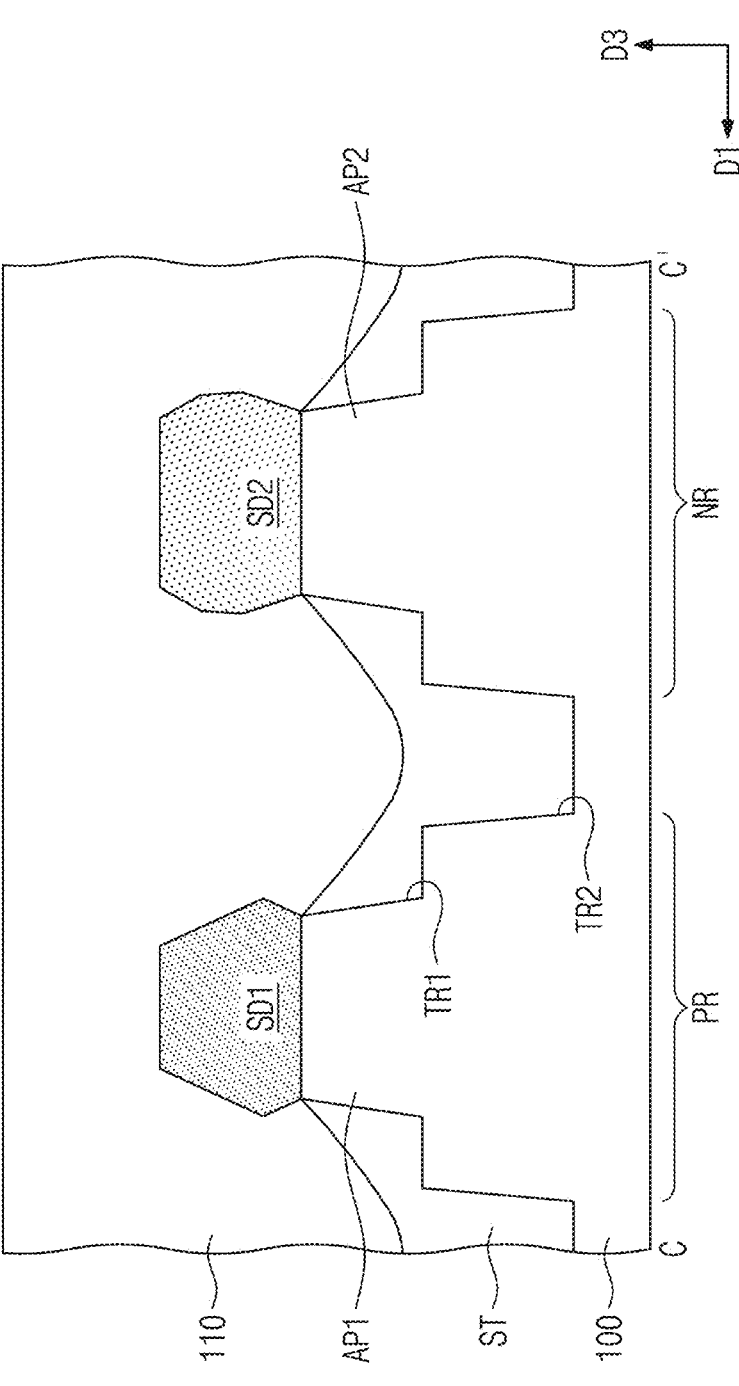
Figure 23D:
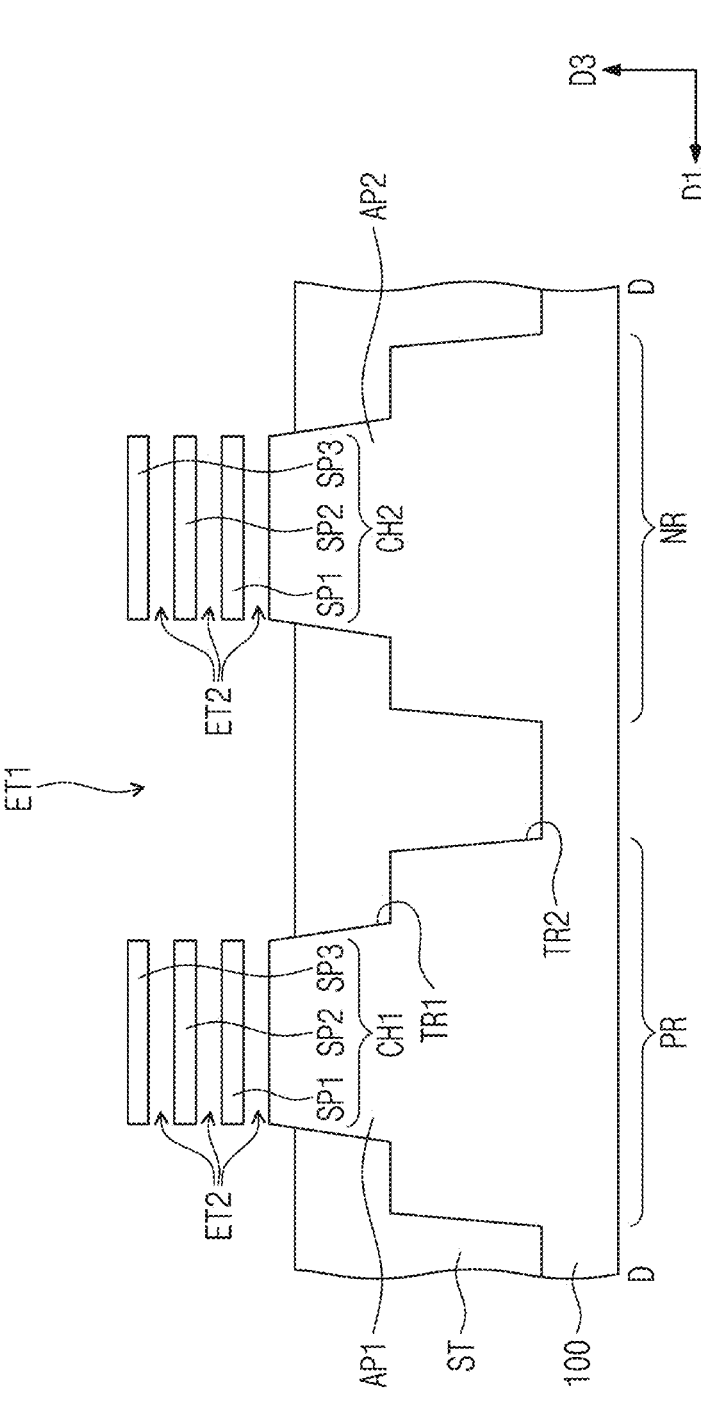
Figure 24:
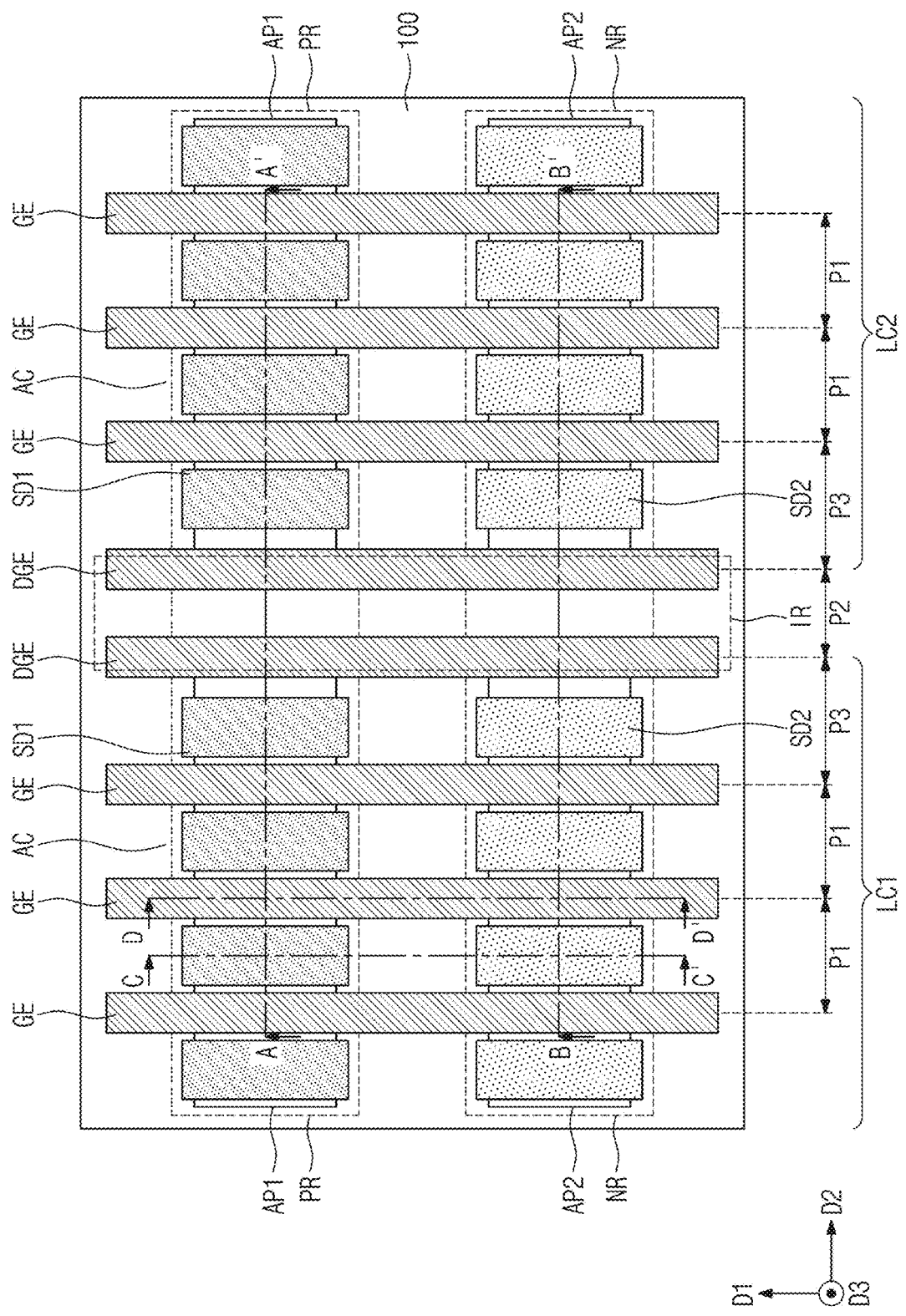
Figure 25B:
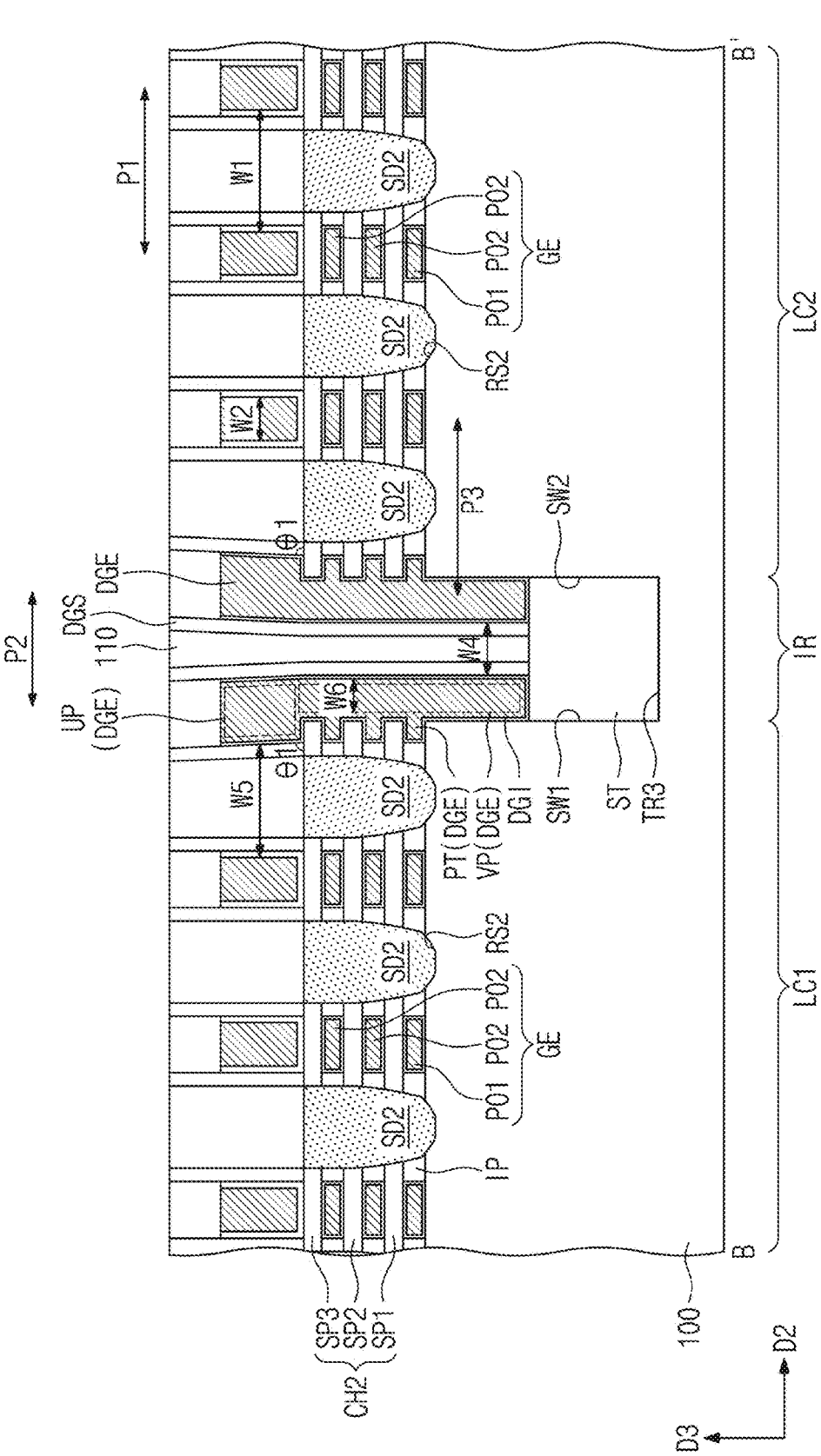
Figure 25C:
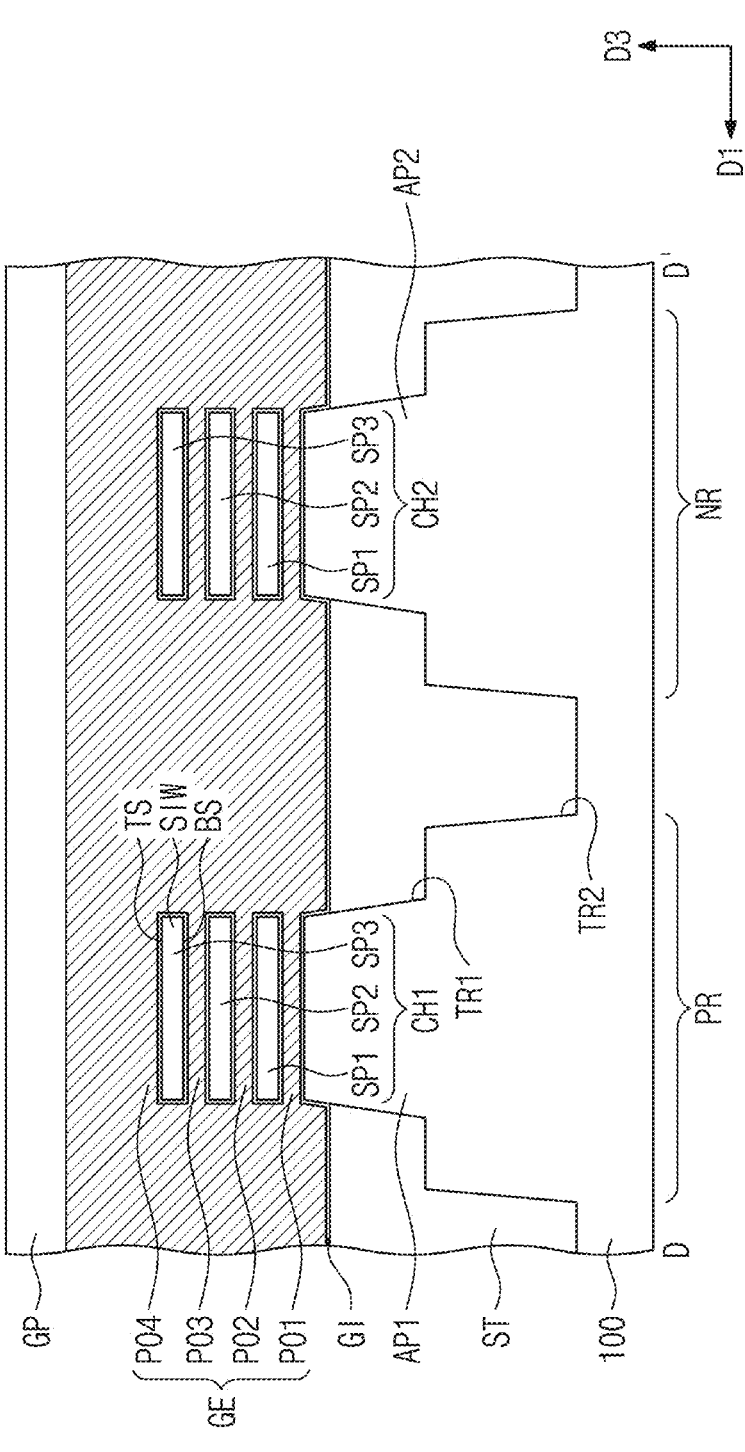
Figure 26A:
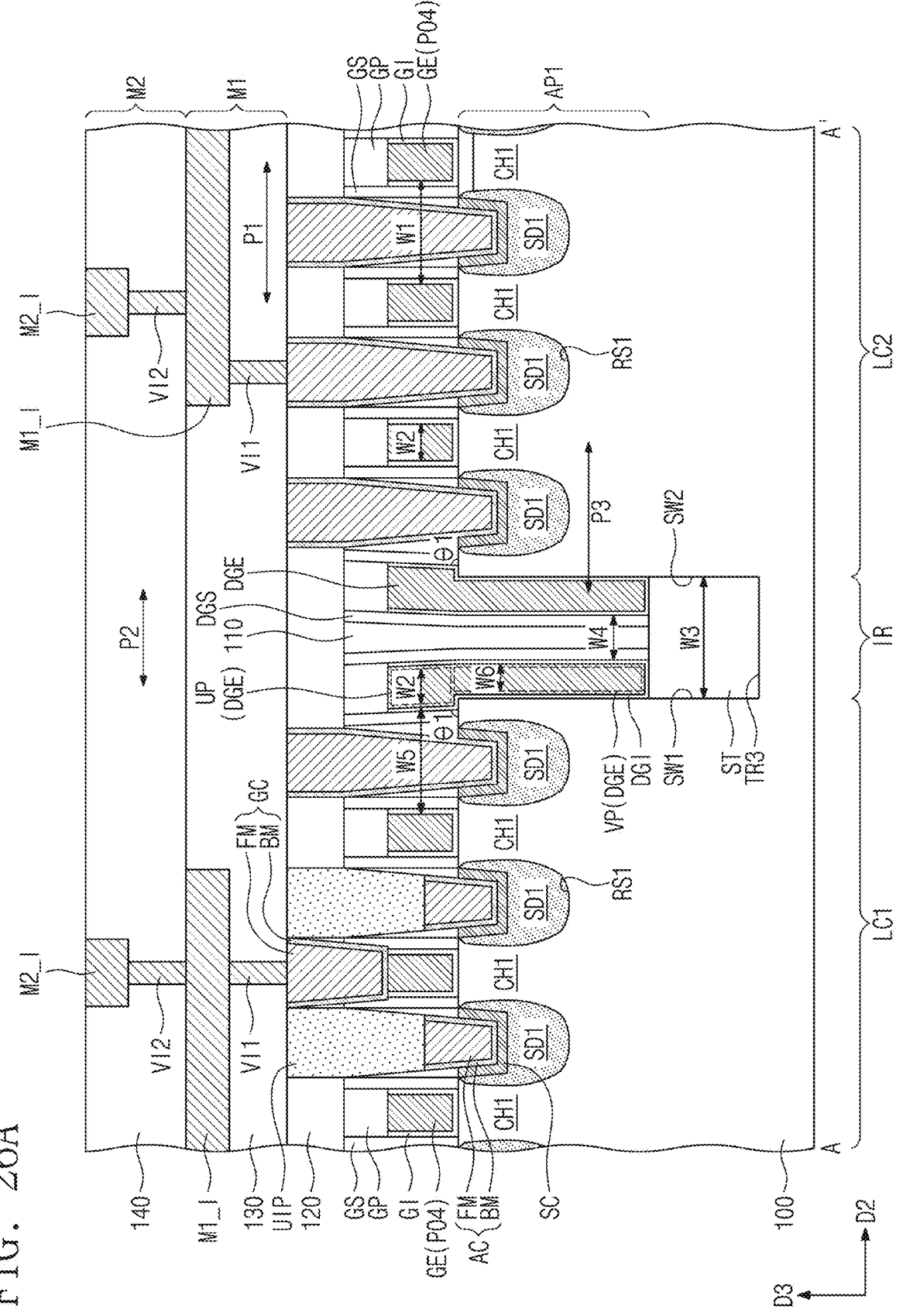
FIGS. 26A to 26D are sectional views taken along lines A-A', B-B', C-C', and D-D', respectively, of FIG. 11.
Figure 26B:
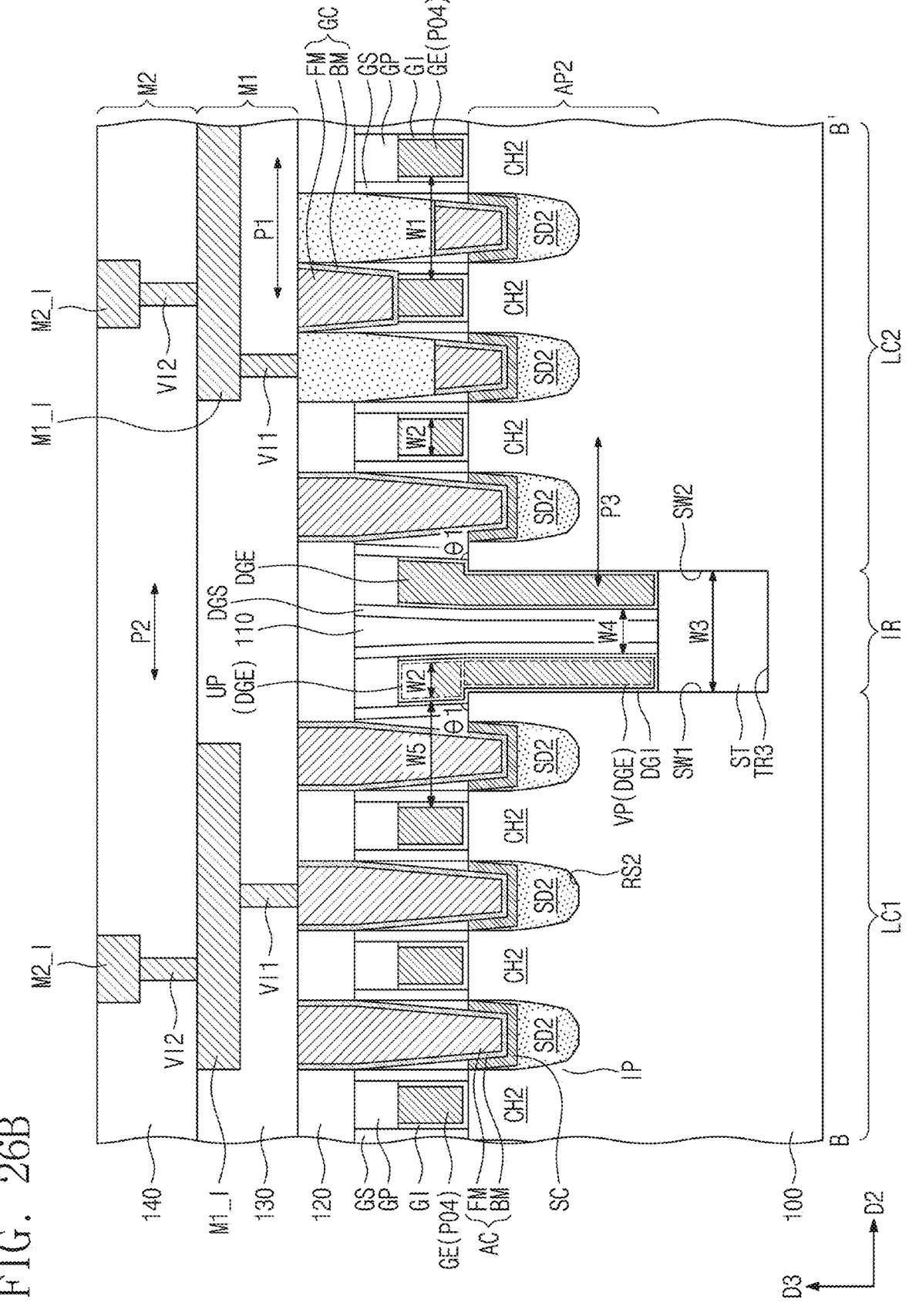
Figure 26C:
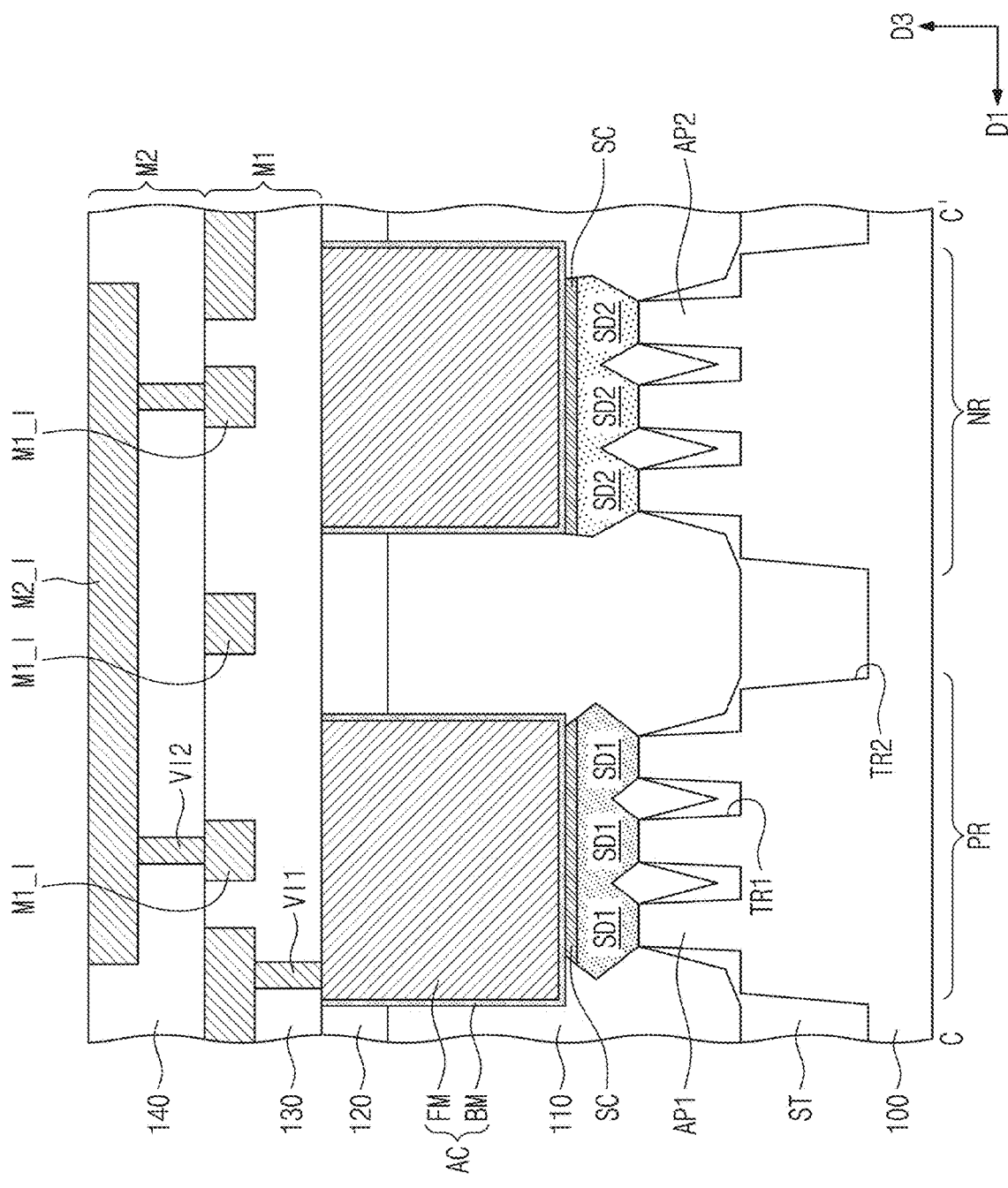
Figure 26D:
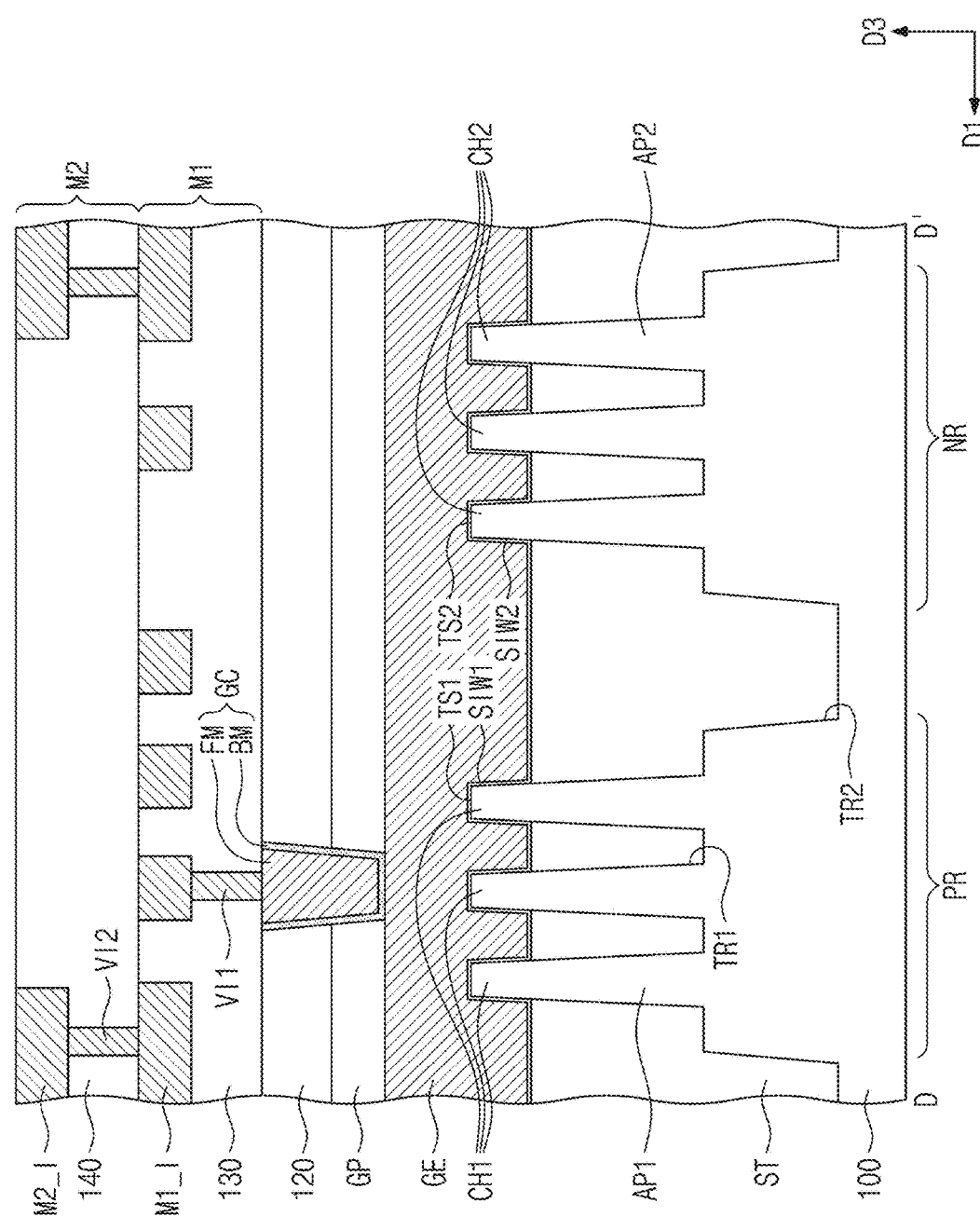

FIGS. 14, 16, 18, 20, 22, and 24 are plan views illustrating a method of fabricating a semiconductor device, according to an embodiment of inventive concepts. FIGS. 15, 17A, 19A, 21A, 23A, and 25A are sectional views taken along lines A-A' of FIGS. 14, 16, 18, 20, 22, and 24, respectively. FIGS. 17B, 19B, 21B, 23B, and 25B are sectional views taken along lines B-B' of FIGS. 16, 18, 20, 22, and 24, respectively. FIGS. 21C and 23C are sectional views taken along lines C-C' of FIGS. 20 and 22, respectively. FIGS. 21D, 23D, and 25C are sectional views taken along lines D-D' of FIGS. 20, 22, and 24, respectively.

Figure 14:
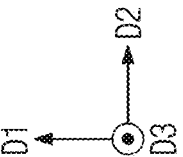
Figure 15:
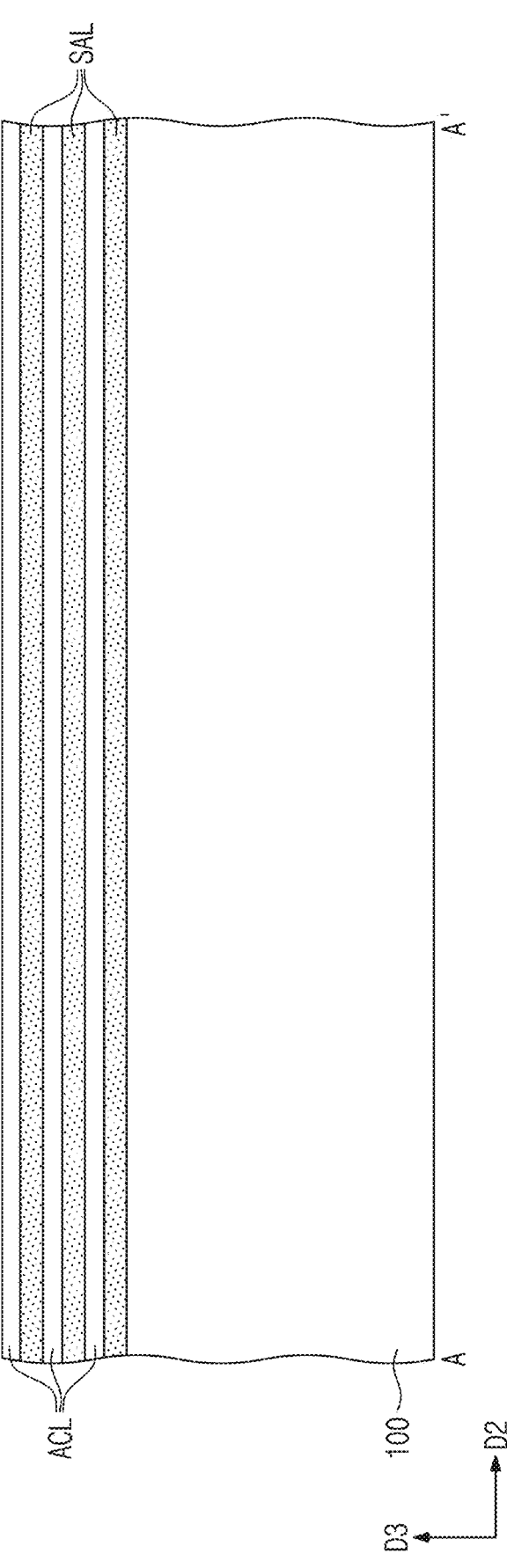

Referring to FIGS. 14 and 15, the sacrificial layers SAL and the active layers ACL may be alternately formed on the substrate 100. The sacrificial and active layers SAL and ACL may be formed of or include at least one of silicon (Si), germanium (Ge), or silicon germanium (SiGe), but the material of the active layers ACL may be different from that of the sacrificial layers SAL. For example, the sacrificial layers SAL may be formed of or include silicon-germanium (SiGe), and the active layers ACL may be formed of or include silicon (Si).

The sacrificial layers SAL and the active layers ACL may be formed by an epitaxial growth process using the substrate 100 as a seed layer. The sacrificial layers SAL and the active layers ACL may be conformally formed on the substrate 100.

Figure 16:
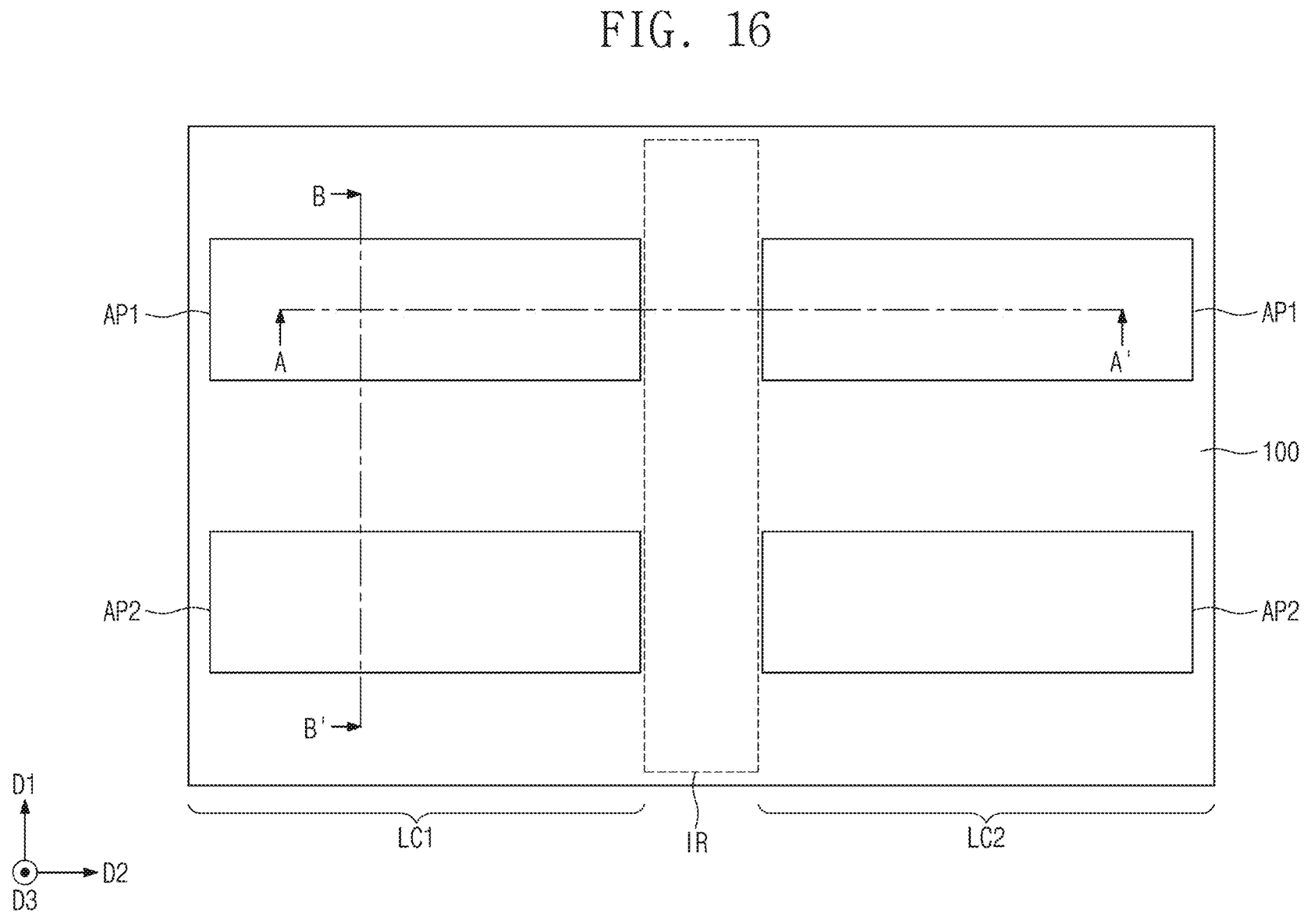
Figure 17A:
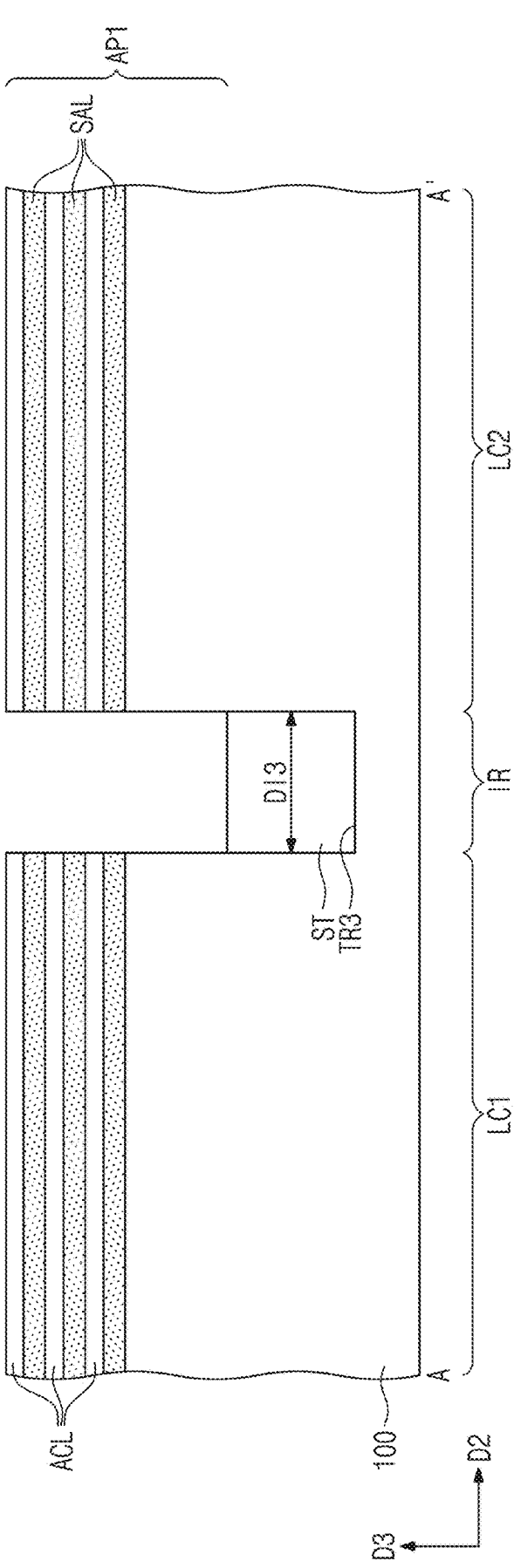
Figure 17B:
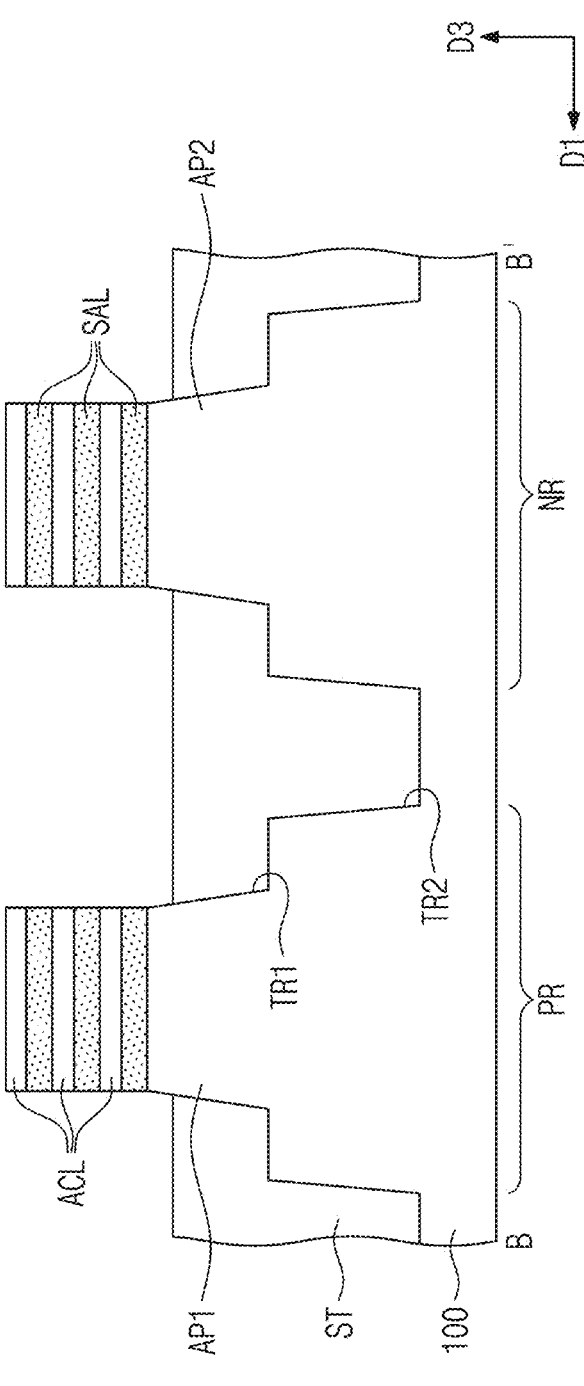
FIGS. 17B, 19B, 21B, 23B, and 25B are sectional views taken along lines B-B' of FIGS. 16, 18, 20, 22, and 24, respectively.

Referring to FIGS. 16, 17A, and 17B, mask patterns may be respectively formed on the PMOSFET and NMOSFET regions PR and NR of the substrate 100. The mask pattern may be a line- or bar-shaped pattern extending in the second direction D2.

A first patterning process, in which the mask patterns are used as an etch mask, may be performed to form the first trench TR1 defining the first and second active patterns AP1 and AP2. The first and second active patterns AP1 and AP2 may be formed on the PMOSFET and NMOSFET regions PR and NR, respectively. Each of the first and second active patterns AP1 and AP2 may include the sacrificial layers SAL and the active layers ACL, which are alternately stacked in an upper portion thereof.

A second patterning process may be performed on the substrate 100 to form the second trench TR2 defining the PMOSFET and NMOSFET regions PR and NR. The second trench TR2 may be formed to have a depth that is larger than that of the first trench TR1.

A cutting process may be performed on the substrate 100 to form the third trench TR3, which divides the first active pattern AP1 into an adjacent pair of the first active patterns AP1 and divides the second active pattern AP2 into an adjacent pair of the second active patterns AP2. The third trench TR3 may correspond to a region, in which the cutting pattern CPa described with reference to FIG. 8 is disposed. A width of the third trench TR3 may correspond to the third distance DI3. The third trench TR3 may include the first side surface SW1 and the second side surface SW2, which are adjacent to the first logic cell LC1 and the second logic cell LC2, respectively.

The device isolation layer ST may be formed on the substrate 100 to fill the first to third trenches TR1, TR2, and TR3. The device isolation layer ST may be formed of or include silicon oxide. The first and second active patterns AP1 and AP2 may include upper portions that are placed above the device isolation layer ST. The device isolation layer ST may directly cover lower portions of the first and second side surfaces SW1 of the third trench TR3.

Referring back to FIGS. 9 and 10, the sacrificial patterns PP and the dummy sacrificial patterns DPP may be formed on the substrate 100 to cross the first and second active patterns AP1 and AP2. Each of the sacrificial patterns PP and the dummy sacrificial patterns DPP may be a line or bar shaped pattern, which is extended in the first direction D1.

In detail, the formation of the sacrificial patterns PP and the dummy sacrificial patterns DPP may include forming a sacrificial layer on the substrate 100, forming masks on the sacrificial layer, and patterning the sacrificial layer using the masks as an etch mask. The sacrificial layer may be formed of or include poly silicon.

Figure 18:
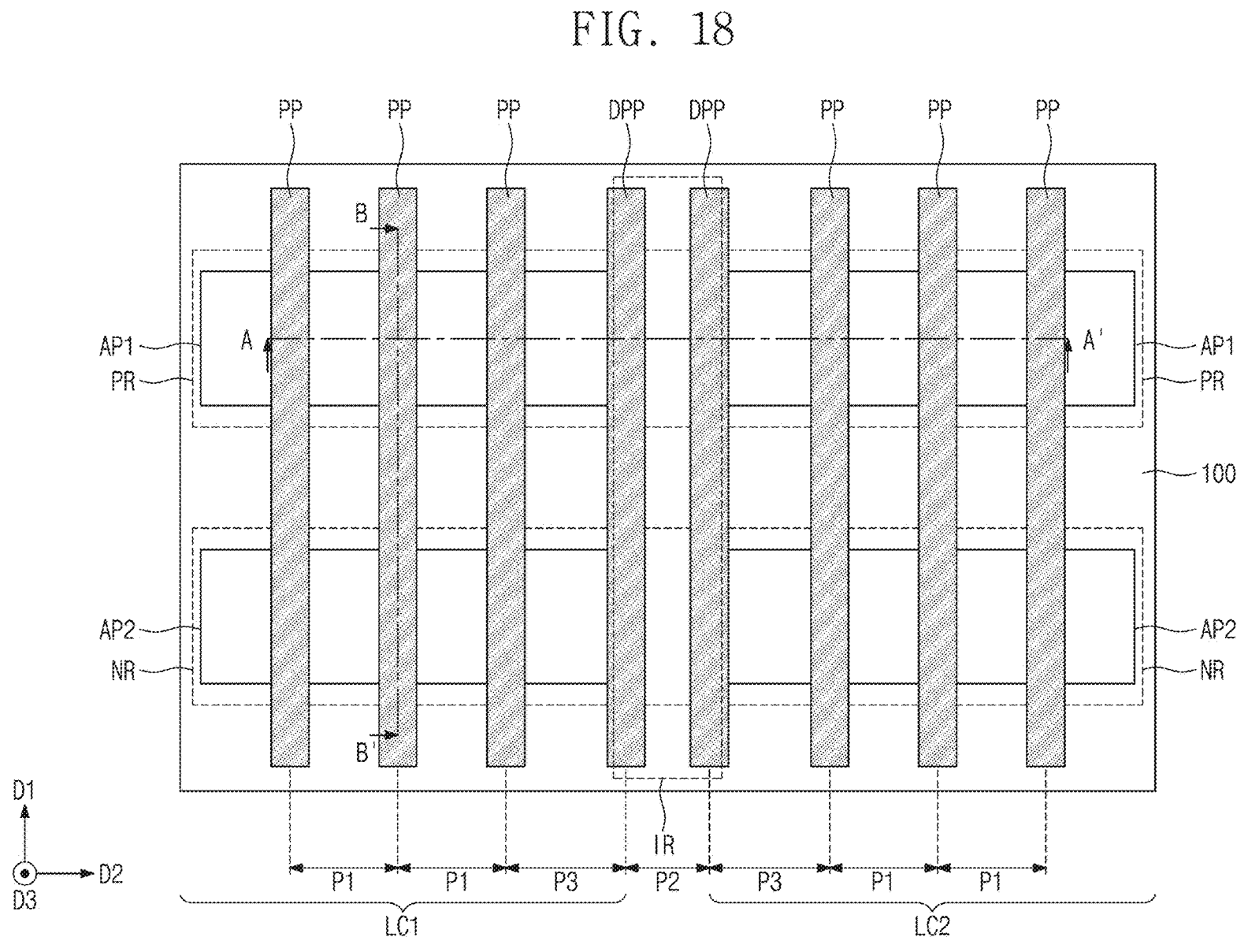
Figure 19A:
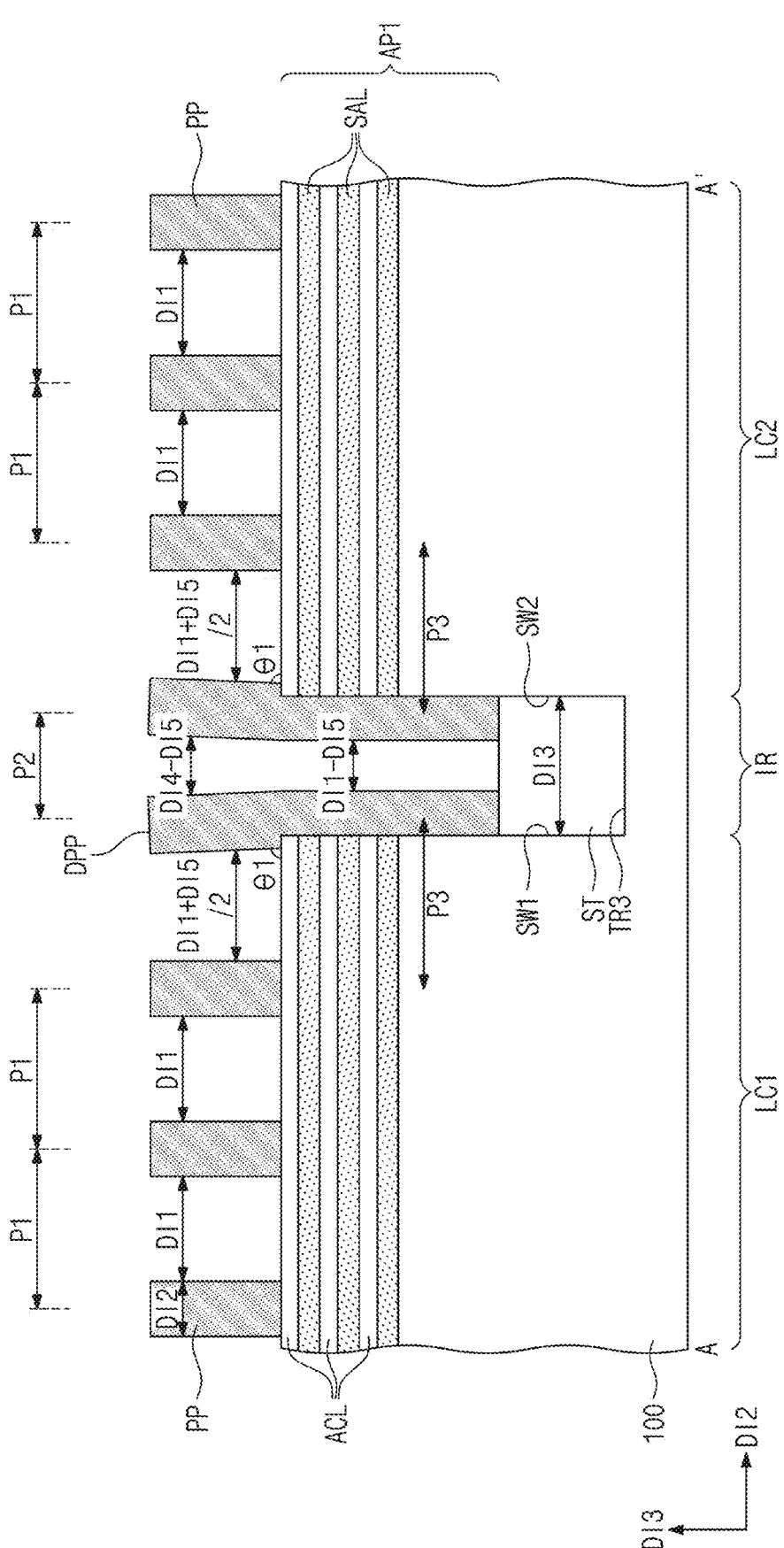
Figure 19B:
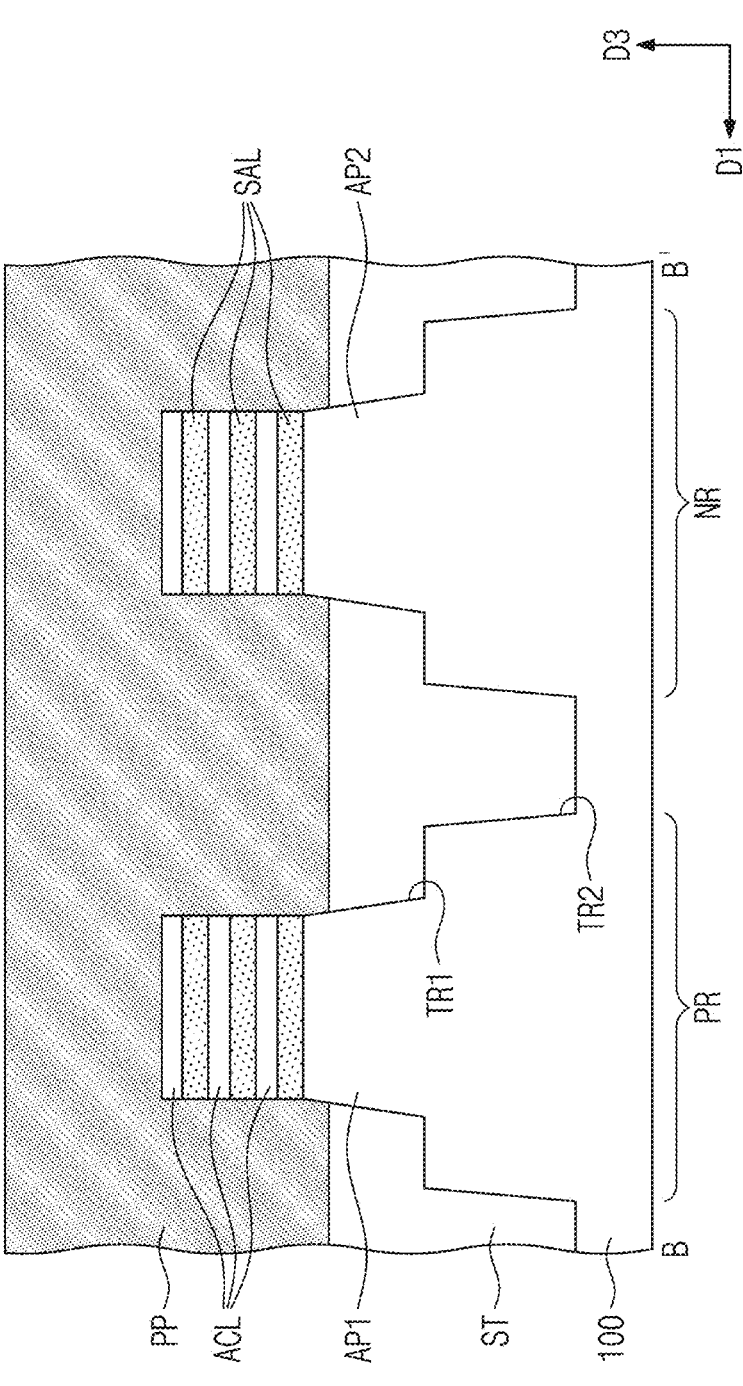
Figure 20:
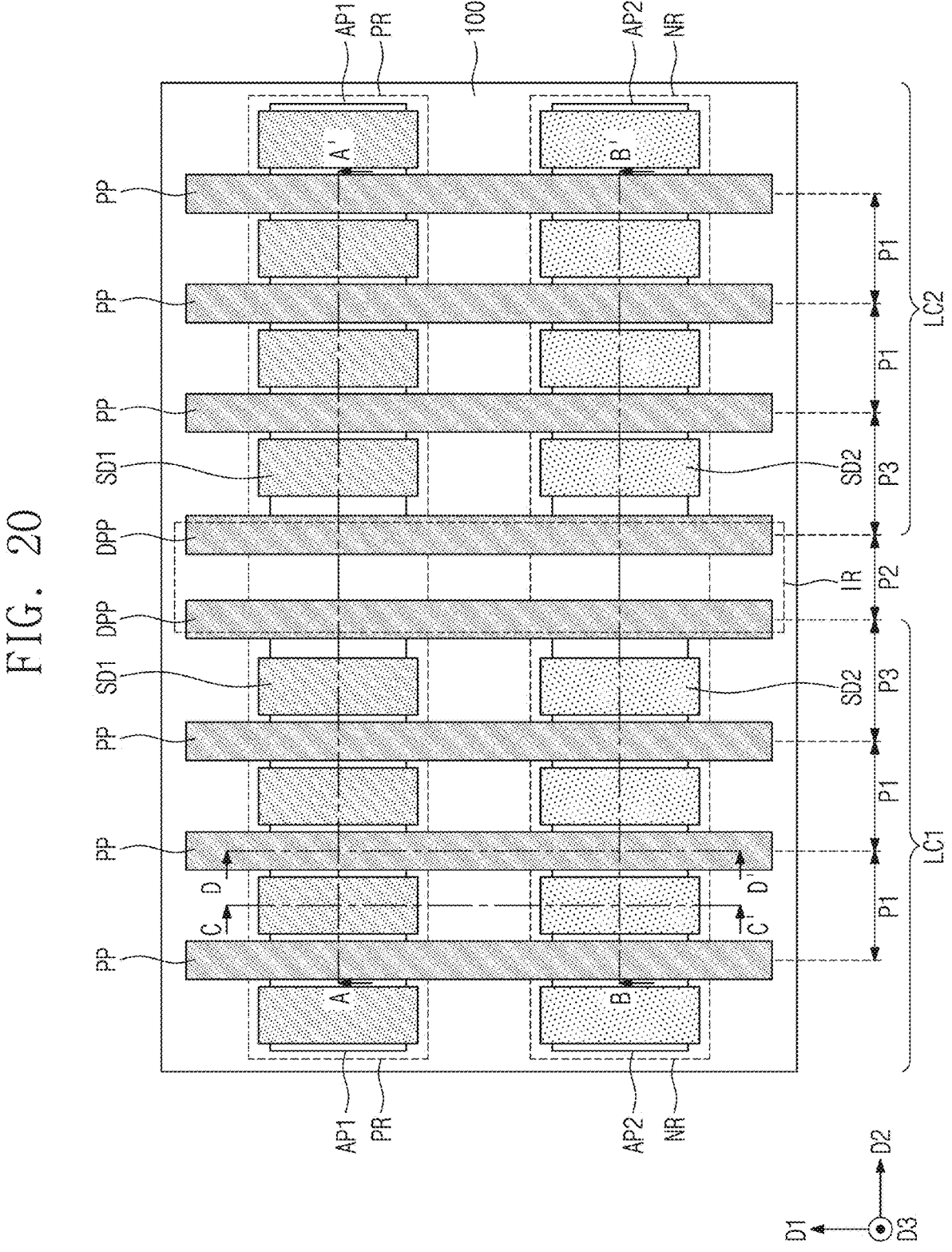

Referring to FIGS. 18, 19A, and 19B, upper portions of the sacrificial patterns PP and the dummy sacrificial patterns DPP may be etched. Here, the largest value of the distance D14-DI5 between the dummy sacrificial patterns DPP may be substantially equal to or similar to the first distance DI1.

Referring to FIGS. 20 and 21A to 21D, hard mask patterns MK may be formed on top surfaces of the sacrificial patterns PP and the dummy sacrificial patterns DPP, respectively. A pair of preliminary gate spacers GS' may be formed on opposite side surfaces of each of the sacrificial patterns PP and the dummy sacrificial patterns DPP. The formation of the preliminary gate spacers GS' may include conformally forming a gate spacer layer on the substrate 100 and aniso-tropically etching the gate spacer layer. The gate spacer layer may be formed of or include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

The first recesses RS1 may be formed in an upper portion of the first active pattern AP1. The second recesses RS2 may be formed in upper portions of the second active pattern AP2. During the formation of the first and second recesses RS1 and RS2, the device isolation layer ST may be recessed at both sides of each of the first and second active patterns AP1 and AP2 (e.g., see FIG. 21C).

In detail, the first recesses RS1 may be formed by etching the upper portion of the first active pattern AP1 using the hard mask patterns MK and the preliminary gate spacers GS' as an etch mask. The first recess RS1 may be formed between a pair of the sacrificial patterns PP and between the dummy sacrificial pattern DPP and the sacrificial pattern PP adjacent thereto. The second recesses RS2 of the second active pattern AP2 may be formed by the same method as the first recesses RS1.

The first source/drain patterns SD1 may be formed in the first recesses RS1, respectively. In detail, the first source/drain pattern SD1 may be formed by a SEG process, in which an inner surface of the first recess RS1 is used as a seed layer. For example, the first source/drain pattern SD1 may be grown using the first to third semiconductor patterns SP1, SP2, and SP3 and the substrate 100, which are exposed by the first recess RS1, as the seed layer. As a result of the formation of the first source/drain patterns SD1, the first channel pattern CH1 may be defined between each pair of the first source/drain patterns SD1. In an embodiment, the SEG process may include a chemical vapor deposition (CVD) process or a molecular beam epitaxy (MBE) process. The first source/drain patterns SD1 may include a semicon-ductor material (e.g., SiGe) whose lattice constant is greater than that of the substrate 100. Each of the first source/drain patterns SD1 may be a multi-layered structure including a plurality of semiconductor layers.

As an example, during the SEG process of forming the first source/drain patterns SD1, the first source/drain patterns SD1 may be doped in-situ with impurities. Alternatively, impurities may be injected into the first source/drain pattern SD1, after the formation of the first source/drain pattern SD1. The first source/drain pattern SD1 may be doped to have a first conductivity type (e.g., a p-type).

The inner spacers IP may be formed by partially removing the sacrificial layers SAL, which are exposed by the second recesses RS2. The second source/drain patterns SD2 may be formed in the second recesses RS2, respectively. In detail, the second source/drain pattern SD2 may be formed by a SEG process using an inner surface of the second recess RS2 as a seed layer. In an embodiment, the second source/drain pattern SD2 may be formed of or include the same semi-conductor material (e.g., Si) as the substrate 100. The second source/drain pattern SD2 may be doped to have a second conductivity type (e.g., n-type). As a result of the formation of the second source/drain patterns SD2, the second channel pattern CH2 may be defined between each pair of the second source/drain patterns SD2.

Referring to FIGS. 22 and 23A to 23D, the first interlayer insulating layer 110 may be formed to cover the first and second source/drain patterns SD1 and SD2, the hard mask patterns MK, and the preliminary gate spacers GS'. In an embodiment, the first interlayer insulating layer 110 may include a silicon oxide layer.

The first interlayered insulating layer 110 may be planar-ized to expose top surfaces of the sacrificial patterns PP and the dummy sacrificial patterns DPP. The planarization of the first interlayer insulating layer 110 may be performed using an etch-back or chemical-mechanical polishing (CMP) pro-cess. All of the hard mask patterns MK may be removed during the planarization process. The planarization process may transform the preliminary gate spacers GS' (see FIG. 21A) into the gate spacers GS. As a result, the first inter-layered insulating layer 110 may have a top surface that is substantially coplanar the top surfaces of the sacrificial patterns PP, the dummy sacrificial patterns DPP, and the gate spacers GS.

The sacrificial patterns PP and the dummy sacrificial patterns DPP may be removed to form first empty spaces ET1 exposing the first and second active patterns AP1 and AP2. The sacrificial layers SAL of each of the first and second active patterns AP1 and AP2 may be exposed through the first empty space ET1.

The exposed sacrificial layers SAL may be selectively removed through the first empty space ET1. In detail, a process of selectively etching the sacrificial layers SAL may be performed to remove only the sacrificial layers SAL (that is, to leave the first to third semiconductor patterns SP1, SP2, and SP3). Due to the inner spacers IP, it may be possible to limit and/or prevent a defect from occurring in the second source/drain pattern SD2 during this process.

Only the first to third semiconductor patterns SP1, SP2, and SP3 may be left on each of the first and second active patterns AP1 and AP2. Second empty spaces ET2 may be formed as a result of the removal of the sacrificial layers SAL. The second empty spaces ET2 may be defined between the first to third semiconductor patterns SP1, SP2, and SP3.

Referring to FIGS. 24 and 25A to 25C, the gate insulating layer GI may be conformally formed in the first and second empty spaces ET1 and ET2. The gate electrode GE may be formed on the gate insulating layer GI. The gate electrode GE may be formed to fill the first and second empty spaces ET1 and ET2. In detail, the gate electrode GE may include the first to third portions PO1, PO2, and PO3 filling the second empty spaces ET2. The gate electrode GE may further include the fourth portion PO4 filling the first empty space ET1. The gate capping pattern GP may be formed on the gate electrode GE.

The dummy gate electrode DGE may be formed adjacent to the third trench TR3. The gate spacer GS, which is provided on a side surface of the dummy gate electrode DGE, may be referred to as a dummy gate spacer DGS. The gate insulating layer GI, which is interposed between the dummy gate electrode DGE and the first channel pattern CH1 and between the dummy gate electrode DGE and the second channel pattern CH2, may be referred to as the dummy gate insulating layer DGI.

Referring back to FIGS. 11 and 12A to 12D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

FIGS. 26A to 26D are sectional views taken along lines A-A', B-B', C-C', and D-D', respectively, of FIG. 11. In the following description of the present embodiment, an element previously described with reference to FIGS. 11 and 12A to 12D may be identified by the same reference number without repeating an overlapping description thereof, for concise description.

Referring to FIGS. 11 and 26A to 26D, the PMOSFET and NMOSFET regions PR and NR may be defined by the second trench TR2, which is formed in an upper portion of the substrate 100. The first trench TR1 may be defined between adjacent ones of the first active patterns AP1 and between adjacent ones of the second active patterns AP2. The first trench TR1 may be shallower than the second trench TR2. The third trench TR3 may separate the first and second logic cells LC1 and LC2 from each other.

The device isolation layer ST may be provided to fill the first to third trenches TR1, TR2, and TR3. An upper portion of each of the first and second active patterns AP1 and AP2 may be a protruding pattern, which is vertically extended above the device isolation layer ST. The upper portion of each of the first and second active patterns AP1 and AP2 may have a fin shape. The device isolation layer ST may not cover the upper portion of each of the first and second active patterns AP1 and AP2. The device isolation layer ST may cover a lower side surface of each of the first and second active patterns AP1 and AP2.

The first source/drain patterns SD1 may be provided in the upper portions of the first active patterns AP1. The first source/drain patterns SD1 may be impurity regions of a first conductivity type (e.g., p-type). The first channel pattern CH1 may be interposed between each pair of the first source/drain patterns SD1. The second source/drain patterns SD2 may be provided in the upper portions of the second active patterns AP2. The second source/drain patterns SD2 may be impurity regions of a second conductivity type (e.g., n-type). The second channel pattern CH2 may be interposed between each pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The gate electrodes GE may be provided to cross the first and second active patterns AP1 and AP2 and to extend in the first direction D1. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 26D, the gate electrode GE may be provided on a first top surface TS1 and at least one first side surface SIW1 of the first channel pattern CH1. The gate electrode GE may be provided on a second top surface TS2 and at least one second side surface SIW2 of the second channel pattern CH2. In other words, the transistor according to the present embodiment may be a three-dimensional field-effect transistor (e.g., FinFET), in which the gate electrode GE is provided to three-dimensionally surround the channel regions CH1 and CH2.

Unlike the dummy gate electrode DGE described with reference to FIGS. 11 and 12A to 12D, the dummy gate electrode DGE in the present embodiment may not include the protruding portions PT. The gate electrode GE, the gate contact GC, the active contact AC, the first metal layer M1, and the second metal layer M2 may be configured to have substantially the same features as those described with reference to FIGS. 11 and 12A to 12D.

According to an embodiment of inventive concepts, an image may be obtained from a large area, in which sacrificial patterns are formed, and then, a plurality of data (e.g., millions to tens of millions) on distances between adjacent ones of the sacrificial and dummy sacrificial patterns may be measured in the vicinity of a region corresponding to a cutting pattern. Accordingly, it may be possible to improve the accuracy in the optical proximity correction, compared with the case that a small amount of data (e.g., tens to hundreds) on distances between adjacent ones of the sacrificial and dummy sacrificial patterns are measured from an image for a specific region of a layout.

According to an embodiment of inventive concepts, an optical proximity correction (OPC) operation may be performed to reduce a distance between dummy gate patterns, which are adjacent to each other. Accordingly, even when a final structure of a dummy gate electrode is inclined, it may be possible to limit and/or prevent a short circuit from being formed between the dummy gate electrode and an active contact adjacent thereto. In addition, it may be possible to limit and/or prevent a short circuit between the dummy gate electrode and a gate electrode, which may occur when a distance between a dummy sacrificial pattern and a sacrificial pattern is reduced and consequently a recess therebetween is formed to a small depth. As a result, it may be possible to improve electrical and reliability characteristics of a semiconductor device.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:

designing a layout, the layout comprising a first gate pattern, a second gate pattern, a first dummy gate pattern, a second dummy gate pattern, a third gate pattern, and a fourth gate pattern, which are sequentially arranged in a first direction;

forming a first sacrificial pattern, a second sacrificial pattern, a third sacrificial pattern, a fourth sacrificial pattern, a first dummy sacrificial pattern, and a second dummy sacrificial pattern on a first substrate using a first photomask manufactured based on the layout, the first sacrificial pattern, the second sacrificial pattern, the third sacrificial pattern, the first dummy sacrificial pattern, and the second dummy sacrificial pattern corresponding to the first gate pattern, the second gate pattern, the third gate pattern, the fourth gate pattern, the first dummy gate pattern, and the second dummy gate pattern, respectively; and performing an optical proximity correction on the layout to provide an OPC-modified layout, wherein the optical proximity correction includes, measuring distances between adjacent ones of the first sacrificial pattern, the second sacrificial pattern, the third sacrificial pattern, the fourth sacrificial pattern, the first dummy sacrificial pattern, and the second dummy sacrificial pattern, which are adjacent to each other in the first direction, to provide measured distances, comparing a mean value of the measured distances with a mean value of target distances to obtain a first distance, the first distance corresponding to a difference between the measured distances and the target distances, reducing a distance between the first dummy gate pattern and the second dummy gate pattern by the first distance, an upper portion of the first substrate comprises a trench, and the first dummy sacrificial pattern and the second dummy sacrificial pattern each include a body portion on the first substrate and a vertical portion extending vertically from the body portion along a side surface of the trench.

2. The method of claim 1, wherein the layout further comprises a cutting pattern between the first dummy gate pattern and the second dummy gate pattern.

3. The method of claim 2, wherein each of the first dummy gate pattern and the second dummy gate pattern comprises a portion that is vertically overlapped with the cutting pattern.

4. The method of claim 2, wherein the trench is formed in a region corresponding to the cutting pattern.

5. The method of claim 2, wherein a width of the cutting pattern in the layout is substantially equal to a pitch between the first gate pattern and the second gate pattern in the layout.

6. The method of claim 1, wherein, in the OPC-modified layout, a pitch between the first dummy gate pattern and the second dummy gate pattern is smaller than a pitch between the first gate pattern and the second gate pattern.

7. The method of claim 1, wherein, in the OPC-modified layout, a pitch between the second gate pattern and the first dummy gate pattern is larger than a pitch between the first gate pattern and the second gate pattern.

8. The method of claim 1, wherein in the performing the optical proximity correction, the reducing the distance between the first dummy gate pattern and the second dummy gate pattern comprises biasing the first dummy gate pattern in a direction toward the second dummy gate pattern by half of the first distance and biasing the second dummy gate pattern in a direction toward the first dummy gate pattern by half of the first distance.

9. The method of claim 1, wherein the layout comprises a first standard cell and a second standard cell, which are adjacent to each other in the first direction, the first gate pattern, the second gate pattern, and the first dummy gate pattern are on the first standard cell, the second dummy gate pattern, the third gate pattern, and the fourth gate pattern are on the second standard cell, and a pitch between the first gate pattern and the second gate pattern is substantially equal to a pitch between the third gate pattern and the fourth gate pattern.

10. The method of claim 1, further comprising:

manufacturing a second photomask, based on the OPC-modified layout; and performing a semiconductor process on a second substrate using the second photomask.

11. A method of fabricating a semiconductor device, comprising:

designing a layout, the layout comprising a first standard cell and a second standard cell, the first standard cell including a first gate pattern, a second gate pattern, and a first dummy gate pattern sequentially arranged in a first direction, the second standard cell including a second dummy gate pattern, a third gate pattern, and a fourth gate pattern sequentially arranged in the first direction, and the first standard cell and the second standard cell being adjacent to each other in the first direction;

forming a first sacrificial pattern, a second sacrificial pattern, a third sacrificial pattern, a fourth sacrificial pattern, a first dummy sacrificial pattern, and a second dummy sacrificial pattern on a substrate using a photomask manufactured based on the layout, the first sacrificial pattern, the second sacrificial pattern, the third sacrificial pattern, the first dummy sacrificial pattern, and the second dummy sacrificial pattern corresponding to the first gate pattern, the second gate pattern, the third gate pattern, the fourth gate pattern, the first dummy gate pattern, and the second dummy gate pattern, respectively; and performing an optical proximity correction on the layout to provide an OPC-modified layout, wherein the first dummy gate pattern and the second dummy gate pattern are adjacent to each other in the first direction, and the optical proximity correction includes, measuring distances between adjacent ones of the first sacrificial pattern, the second sacrificial pattern, the third sacrificial pattern, the fourth sacrificial pattern, the first dummy sacrificial pattern, and the second dummy sacrificial pattern, which are adjacent to each other in the first direction, to provide measured distances, comparing a mean value of the measured distances with a mean value of target distances to obtain a first distance, the first distance corresponding to a difference between the measured distances and the target distances, biasing the first dummy gate pattern toward the second dummy gate pattern by half of the first distance and biasing the second dummy gate pattern toward the first dummy gate pattern by half of the first distance, an upper portion of the substrate comprises a trench, and the first dummy sacrificial pattern and the second dummy sacrificial pattern each include a body portion on the substrate and a vertical portion extending vertically from the body portion along a side surface of the trench.

12. The method of claim 11, wherein the layout further comprises a cutting pattern between the first standard cell and the second standard cell, and each of the first dummy gate pattern and the second dummy gate pattern comprises a portion that is vertically overlapped with the cutting pattern.

13. The method of claim 12, wherein the trench is formed in a region corresponding to the cutting pattern.

14. The method of claim 11, wherein a pitch between the first gate pattern and the second gate pattern is substantially equal to a pitch between the third gate pattern and the fourth gate pattern.

15. The method of claim 11, wherein, in the OPC-modified layout, a pitch between the first dummy gate pattern and the second dummy gate pattern is smaller than a pitch between the first gate pattern and the second gate pattern.

* * * * *